United States Patent
Ohara et al.

(10) Patent No.: US 7,973,609 B2
(45) Date of Patent: Jul. 5, 2011

(54) DIGITALLY-CONTROLLED OSCILLATOR, FREQUENCY SYNTHESIZER AND RADIO COMMUNICATION DEVICE

(75) Inventors: Atsushi Ohara, Shiga (JP); Shinichiro Uemura, Osaka (JP); Hisashi Adachi, Osaka (JP)

(73) Assignee: Panasonic Corporation, Osaka (JP)

( * ) Notice: Subject to any disclaimer, the term of this patent is extended or adjusted under 35 U.S.C. 154(b) by 181 days.

(21) Appl. No.: 12/536,120

(22) Filed: Aug. 5, 2009

(65) Prior Publication Data

US 2010/0066416 A1    Mar. 18, 2010

(30) Foreign Application Priority Data

Sep. 16, 2008  (JP) ................. 2008-236265

(51) Int. Cl.
*H03B 27/00* (2006.01)
(52) U.S. Cl. ....... 331/57; 331/45; 331/177 V; 331/36 C; 455/260
(58) Field of Classification Search .................. 331/45, 331/177 V, 57, 36 C; 455/260
See application file for complete search history.

(56) References Cited

U.S. PATENT DOCUMENTS

| 5,640,112 A * | 6/1997 | Goto et al. ............... 327/141 |
| 6,556,089 B2 | 4/2003 | Wood |
| 6,734,741 B2 | 5/2004 | Staszewski et al. |
| 2002/0033737 A1 | 3/2002 | Staszewski et al. |
| 2003/0006851 A1 | 1/2003 | Wood |

FOREIGN PATENT DOCUMENTS

JP    2002-033660 A    1/2002

* cited by examiner

*Primary Examiner* — Arnold Kinkead
(74) *Attorney, Agent, or Firm* — McDermott Will & Emery LLP

(57) ABSTRACT

A frequency synthesizer includes a digitally-controlled oscillator and an oscillation frequency control unit. The digitally-controlled oscillator includes a loop-shaped transmission line path having an odd number of parallel portions in each of which two conductors are arranged in parallel to each other with a space therebetween, and an odd number of intersection portions in each of which two conductors intersect spatially, an active circuit coupled between the two conductors, and a first variable capacitance unit and a second variable capacitance unit. The oscillation frequency control unit includes a $\Sigma\Delta$ modulation circuit for subjecting to $\Sigma\Delta$ modulation a first control signal for switching a high capacitance state and a low capacitance state of a first variable capacitance element included in the first variable capacitance unit.

28 Claims, 18 Drawing Sheets

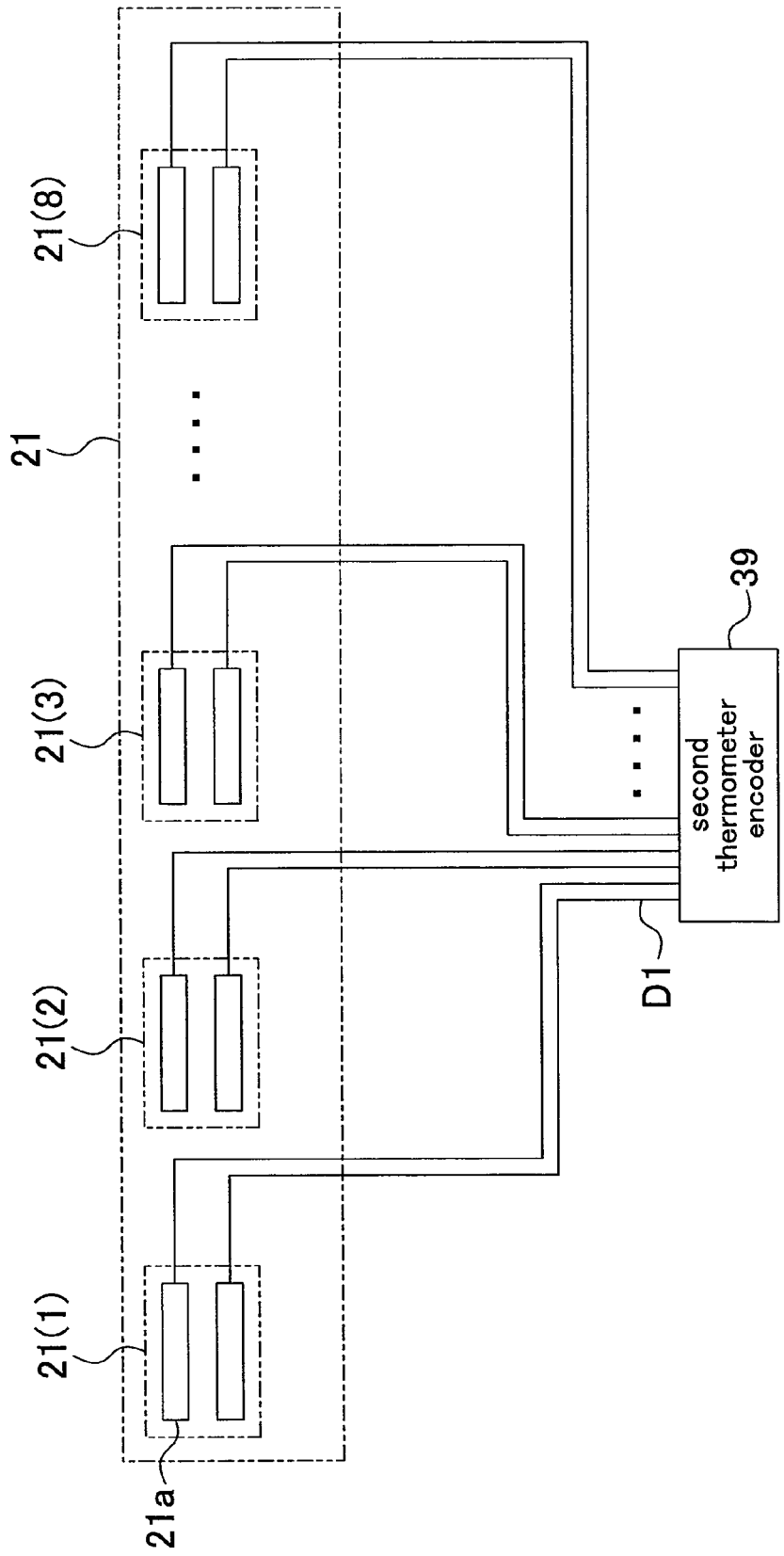

DIGITALLY-CONTROLLED OSCILLATOR, FREQUENCY SYNTHESIZER AND RADIO COMMUNICATION DEVICE

CROSS REFERENCE TO RELATED APPLICATIONS

This application claims priority under 35 U.S.C. §119(a) on Patent Application No. 2008-236265 filed in Japan on Sep. 16, 2008, the entire contents of which are hereby incorporated by reference.

BACKGROUND

The present disclosure relates to a digitally-controlled oscillator, a frequency synthesizer and a radio communication device for use in a semiconductor integrated circuit.

In order to achieve a reduction in size and an increase in speed of semiconductor integrated circuits, a frequency synthesizer which employs a digitally-controlled oscillator (DCO) circuit for controlling an output frequency using digital values has been studied instead of a voltage-controlled oscillator (VCO), which controls an output frequency using analog voltages.

In the DCO circuit, it is necessary to change a frequency within a wide range, and reduce a minimum frequency change amount to the extent possible while achieving a constant change amount, so as to perform wide-range modulation while reducing quantization noise.

A DCO circuit as shown in FIG. 19 has been proposed so as to change a frequency within a wide range while reducing a minimum frequency change amount (see, for example, Japanese Unexamined Patent Application Publication No. 2002-33660 or U.S. Pat. No. 6,734,741). As shown in FIG. 19, the conventional DCO circuit 200 has an inductor 201 and a variable capacitance unit 202. The inductor 201 and the variable capacitance unit 202 form an LC tank circuit, which generates an oscillating signal having a frequency which depends on the inductance of the inductor 201 and the capacitance value of the variable capacitance unit 202.

The variable capacitance unit 202 has a first variable capacitance unit 205, a second variable capacitance unit 204, and a third variable capacitance unit 203. The first, second and third variable capacitance units 205, 204 and 203 each have a plurality of varactor elements. Each varactor element is a variable-capacitance element having a capacitance value varying between a low value (low capacitance state) and a high value (high capacitance state).

The first, second and third variable capacitance units 205, 204 and 203 include respective varactor elements having different capacitance values and different capacitance change amounts. Therefore, for example, the frequency can be finely changed by changing the capacitance states of the varactor elements included in the first variable capacitance unit 205. The frequency can be largely changed by changing the capacitance states of the varactor elements included in the third variable capacitance unit 203.

SUMMARY

However, the conventional DCO circuit has the following problems. When the oscillation frequency is high, the capacitance value and the capacitance change amount of the variable capacitance element need to be considerably small. Also, when the DCO circuit is used in a synthesizer for performing frequency modulation, the minimum frequency change amount needs to be decreased so as to reduce quantization noise. To achieve this, the capacitance change amount needs to be considerably small.

The capacitance and the capacitance change amount of the variable capacitance element are determined by the size. Therefore, the variable capacitance element needs to have a small size. However, the size of the variable capacitance element is limited by the fabrication process.

Also, when the capacitance value and the capacitance change amount of the variable capacitance element are small, the parasitic capacitance is not negligible. In order to achieve wide-range modulation while reducing the minimum frequency change amount, a large number of variable capacitance elements having a small capacitance need to be provided. Therefore, the parasitic capacitance increases. Moreover, the number of control lines for controlling the variable capacitance elements increases, and therefore, the parasitic capacitance caused by the control lines also increases. As a result, the upper limit of the oscillation frequency is reduced or the frequency range is narrowed.

Also, when the oscillation frequency is increased, the value of the inductor is preferably reduced since it has an influence. However, a reduction in the value of the inductor disadvantageously leads to a phase noise degradation.

An object of the present disclosure is to provide a digitally-controlled oscillator and a frequency synthesizer which have a high oscillation frequency and a low minimum frequency change amount without increasing the phase noise of the digitally-controlled oscillator itself.

An example digitally-controlled oscillator according to the present disclosure includes a loop-shaped transmission line path, an active circuit, and a plurality of variable capacitance elements which are controlled in accordance with a digital signal.

Specifically, the example digitally-controlled oscillator of the present disclosure includes a loop-shaped transmission line path having an odd number of parallel portions in each of which two conductors are arranged in parallel to each other with a space therebetween, and an odd number of intersection portions in each of which two conductors intersect spatially, an active circuit coupled between the two conductors, and a variable capacitance unit including a plurality of variable capacitance elements coupled between the two conductors, capacitance values of the plurality of variable capacitance elements being controlled in accordance with digital control data. The variable capacitance unit includes a first variable capacitance unit including a plurality of first variable capacitance elements and a second variable capacitance unit including a plurality of second variable capacitance elements. A high capacitance state and a low capacitance state of each of the first variable capacitance elements are switched in accordance with ΣΔ-modulated control data.

The example digitally-controlled oscillator performs oscillation using the loop-shaped transmission line path and the active circuit. Therefore, the example digitally-controlled oscillator can oscillate at a frequency even when its capacitance value is larger than that of a conventional LC oscillator. Moreover, a change amount of the oscillation frequency with respect to a change amount of the capacitance is smaller than that of a conventional LC oscillator. Therefore, a minimum frequency change amount can be easily reduced without using a minute variable capacitance element. Moreover, the value of an inductor can be increased, whereby phase noise can also be reduced.

An example frequency synthesizer according to the present disclosure includes a digitally-controlled oscillator, and an oscillation frequency control unit for controlling an oscillation frequency of the digitally-controlled oscillator. The digitally-controlled oscillator includes a loop-shaped transmission line path having an odd number of parallel portions in each of which two conductors are arranged in parallel to each other with a space therebetween, and an odd number of intersection portions in each of which two conductors intersect while being electrically isolated from each other, an active circuit coupled between the two conductors, and a first variable capacitance unit including a plurality of first variable capacitance elements coupled between the two conductors and a second variable capacitance unit including a plurality of second variable capacitance elements coupled between the two conductors. The oscillation frequency control unit includes a reference frequency signal generating circuit for generating a reference frequency signal, a comparison signal generating circuit for generating a comparison signal based on an output of the digitally-controlled oscillator, a signal comparing circuit for comparing the reference frequency signal and the comparison signal in terms of at least one of phase and frequency to generate digital control data, and a $\Sigma\Delta$ modulation circuit for subjecting a portion of the digital control data to $\Sigma\Delta$ modulation to generate first control data for switching a high capacitance state and a low capacitance state of each of the plurality of first variable capacitance elements.

The example frequency synthesizer includes the digitally-controlled oscillator in which a frequency change amount with respect to a capacitance change amount is smaller than that of a conventional LC oscillator. Therefore, a minimum frequency change amount can be reduced without providing a considerably minute variable capacitance element. Therefore, quantization noise can be reduced by $\Sigma\Delta$ modulation to a further extent than that of a conventional frequency synthesizer.

An example radio communication device according to the present disclosure includes the example frequency synthesizer, and at least one of a receiver circuit and a transmitter circuit which have a signal quality detecting circuit for detecting signal quality. The oscillation frequency control unit controls the data output selecting circuit so that the signal quality is maximized. Another example radio communication device according to the present disclosure may include the example frequency synthesizer, and at least one of a receiver circuit and a transmitter circuit which have a signal quality detecting circuit for detecting signal quality. The oscillation frequency control unit may control the oscillation output selecting circuit so that the signal quality is maximized.

BRIEF DESCRIPTION OF THE DRAWINGS

FIG. 6 is a block diagram showing an example first variable capacitance unit of the frequency synthesizer of the first embodiment.

DETAILED DESCRIPTION

—Basic Configuration of Oscillator—

Figure 1A:
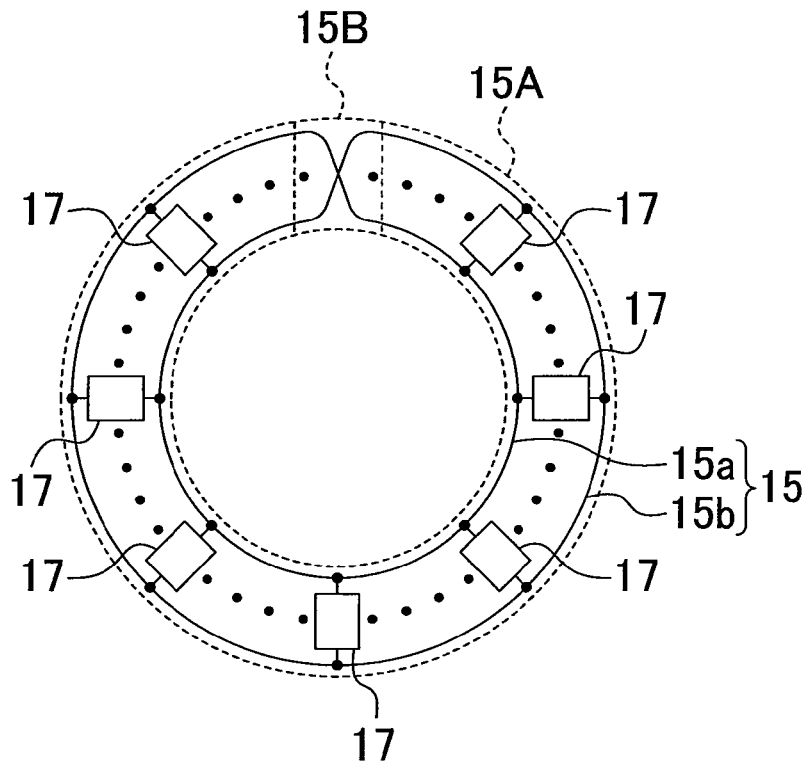
FIG. 1A is a block diagram showing a basic configuration of a digitally-controlled oscillator according to the present disclosure.

Referring to FIG. 1A, a basic configuration of an oscillator according to the present disclosure includes a loop-shaped transmission line path 15 and active circuits 17. The loop-shaped transmission line path 15 has a parallel portion 15A in which a first conductor 15a and a second conductor 15b are arranged in parallel to each other with a space therebetween and an intersection portion 15B in which the first conductor 15a and the second conductor 15b intersect spatially. At the intersection portion 15B, the first conductor 15a and the second conductor 15b are isolated from each other. However, since the transmission line path 15 includes the one parallel portion 15A and the one intersection portion 15B, the first conductor 15a and the second conductor 15b are electrically coupled to each other, thereby forming a single loop-shaped transmission line path 15. The numbers of the parallel portions 15A and the intersection portions 15B are not limited to one, but may be any odd numbers. The active circuits 17 are coupled between the first conductor 15a and the second conductor 15b. Each active circuit 17 is a circuit in which two inverters are connected in parallel and are directed in opposite directions. As a result, inverted amplification energies are supplied to the two parallel conductors, resulting in stable oscillation.

Figure 1B:
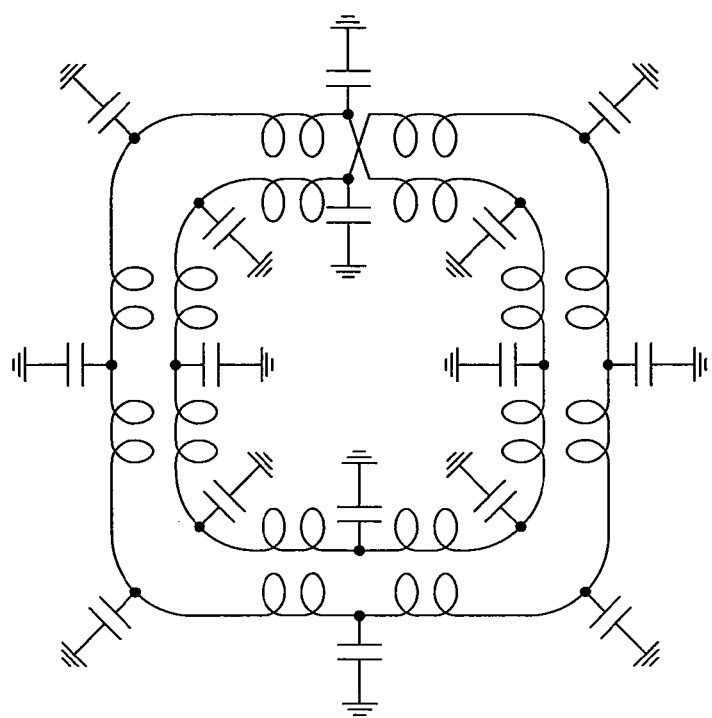
FIG. 1B is a diagram showing an equivalent circuit of the digitally-controlled oscillator of FIG. 1A.

The transmission line path 15 can be considered as a circuit in which a plurality of inductor components and a plurality of capacitance components are connected as shown in FIG. 1B. In this case, a rotational speed $v_p$ of a phase is represented by $$v_p = \frac{1}{\sqrt{L_0 C_0}} \quad (1)$$

where $L_0$ represents an inductor component per unit length and $C_0$ represents a capacitance component per unit length. One round of the transmission line path 15 corresponds to one cycle of the phase. Therefore, an oscillation frequency $f_0$ of the transmission line path 15 can be represented by $$f_0 = \frac{v_p}{2\lambda} = \frac{1}{2\sqrt{L_0 C_0 \cdot \lambda^2}} = \frac{1}{2\sqrt{L_1 C_1}} \quad (2)$$

where $\lambda$ represents a wavelength, $L_1$ represents the sum of inductor components corresponding to half a round of the transmission line path 15, $C_1$ represents the sum of capacitance components to the ground corresponding to half a round of the transmission line path 15. In other words, $L_1$ and $C_1$ represent the sum of inductor components and the sum of capacitances to the ground of the first and second conductors 15a and 15b, respectively. Although FIG. 1 shows a case where the capacitances to the ground are all parasitic capacitances, a capacitance element may be deliberately added. In this case, $C_1$ represents the sum of the capacitance of the added capacitance element and the parasitic capacitances.

Figure 2:
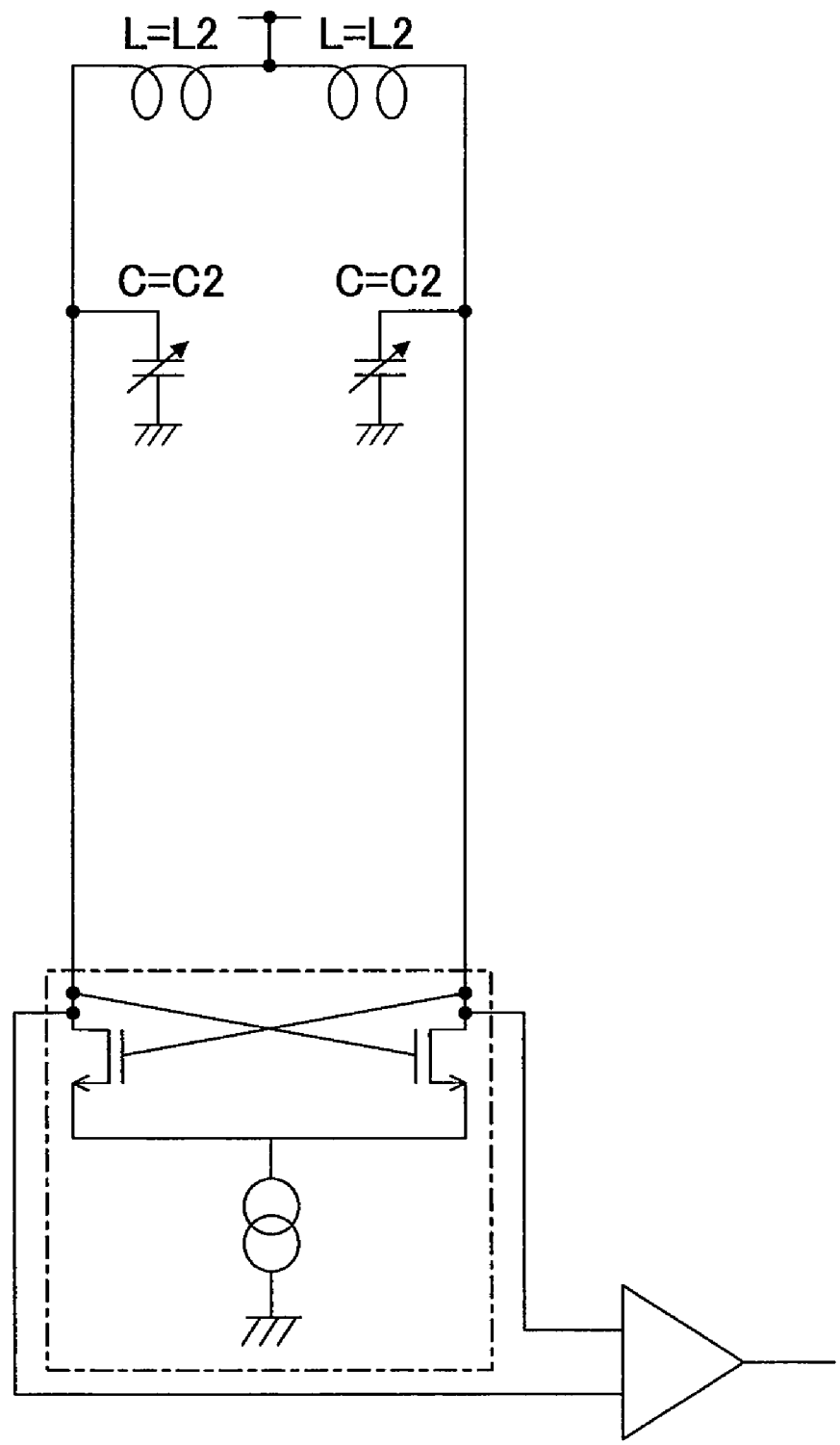
FIG. 2 is a diagram showing an equivalent circuit of a typical LC oscillator.

On the other hand, the oscillation frequency $f_0$ of a typical LC oscillator as shown in FIG. 2 is represented by $$f_0 = \frac{1}{2\pi\sqrt{L_2 C_2}} \quad (3)$$

where $L_2$ represents the sum of inductor components to the ground of one side of the LC circuit performing a differential operation in FIG. 2, and $C_2$ represents the sum of capacitance components to the ground of the one side of the LC circuit.

Therefore, as can be cleared from comparison between the expressions (2) and (3), the oscillator of the present disclosure can achieve a frequency higher by $\pi$ as a factor than that of the conventional LC oscillator when they have the same inductor and capacitance components to the ground. Also, the oscillator of the present disclosure can achieve higher values of the inductor and capacitance components than those of the conventional LC oscillator when they have the same oscillation frequency.

First Embodiment

Figure 3:
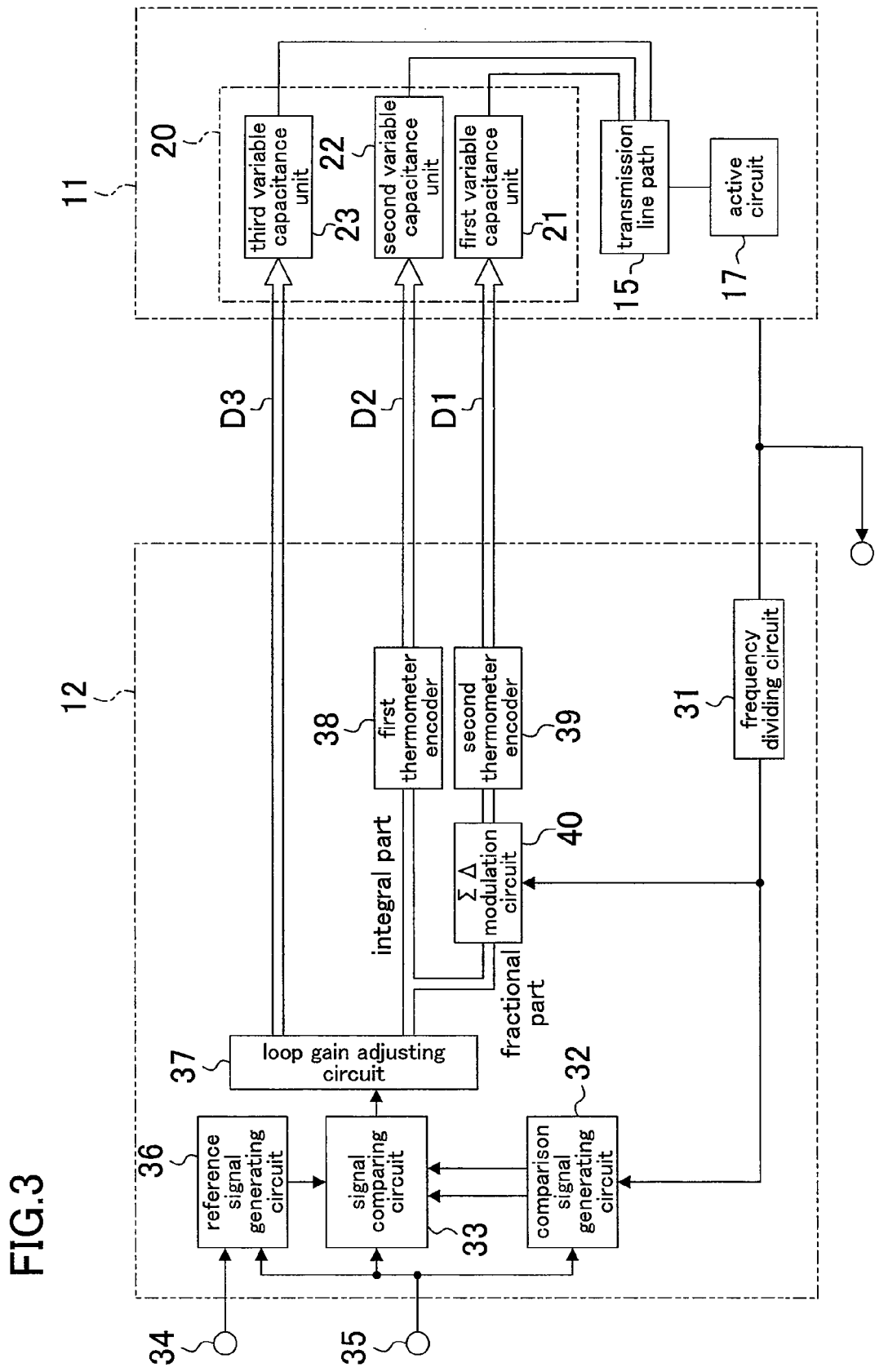
FIG. 3 is a block diagram showing a frequency synthesizer according to a first embodiment.

Hereinafter, a first embodiment of the present disclosure will be described with reference to the drawings. FIG. 3 shows a block configuration of a frequency synthesizer according to the first embodiment. As shown in FIG. 3, the frequency synthesizer of the first embodiment is a phase locked loop (PLL) circuit which includes a digitally-controlled oscillator (DCO) circuit 11, and an oscillation frequency control unit 12 for performing loop control with respect to an oscillation frequency of the DCO circuit 11.

The DCO circuit 11 of this embodiment is an oscillator which basically includes the aforementioned loop-shaped transmission line path 15 and active circuit 17. In this embodiment, the DCO circuit 11 includes a variable capacitance unit 20 for providing a variable oscillation frequency. The variable capacitance unit 20 includes a first variable capacitance unit 21, a second variable capacitance unit 22, and a third variable capacitance unit 23. The first variable capacitance unit 21 includes a plurality of first variable capacitance elements. The second variable capacitance unit 22 includes a plurality of second variable capacitance elements. The third variable capacitance unit 23 includes a plurality of third variable capacitance elements. The variable capacitance unit 20 will be described in detail below.

The oscillation frequency control unit 12 of this embodiment controls the oscillation frequency of the DCO circuit 11 by controlling a capacitance value of the variable capacitance unit 20. An output of the DCO circuit 11 is subjected to frequency division by a frequency dividing circuit 31 as required, before being subjected to processes, such as frequency division, integration and the like, by a comparison signal generating circuit 32, to be converted into a comparison signal. The comparison signal is compared with a reference signal in a signal comparing circuit 33. The reference signal is, for example, generated by a reference signal generating circuit 36 based on frequency select data input from a first data input terminal 34 and a reference frequency signal input from a second data input terminal 35. The signal comparing circuit 33 compares a phase of the comparison signal with a phase of the reference signal, and outputs the result of comparison corresponding to a difference in phase between the comparison signal and the reference signal as a difference signal. The signal comparing circuit 33 may compare frequencies of the comparison signal and the reference signal instead of their phases, or may compare both the phases and the frequencies.

The difference signal is adjusted to an appropriate loop gain by a loop gain adjusting circuit 37 to generate control data for controlling the capacitance value of the variable capacitance unit 20. In this embodiment, the loop gain adjusting circuit 37 outputs control data for rough adjustment and control data for fine adjustment and modulation. The rough adjustment control data is directly used as third control data. The fine adjustment and modulation control data includes an integral part (higher-order bits) and a fractional part (lower-order bits). The integral part is converted from binary data to a thermometer code by a first thermometer encoder 38 to generate second control data. The fractional part is subjected to $\Sigma\Delta$ modulation by a $\Sigma\Delta$ modulation circuit 40 before being converted from binary data to a thermometer code by a second thermometer encoder 39, to generate first control data.

The first control data is transferred through a multi-bit first control line D1 to the first variable capacitance unit 21 and is used to control the capacitance value of the first variable capacitance unit 21. The second control data is transferred through a multi-bit second control line D2 to the second variable capacitance unit 22 and is used to control the capacitance value of the second variable capacitance unit 22. The third control data is transferred through a multi-bit third control line D3 to the third variable capacitance unit 23 and is used to control the capacitance value of the third variable capacitance unit 23.

The first control data is subjected to $\Sigma\Delta$ modulation by the $\Sigma\Delta$ modulation circuit 40. As described below, since a clock of $\Sigma\Delta$ modulation has a high frequency, the first control data which has been subjected to $\Sigma\Delta$ modulation changes at a higher rate than that of the second control data. Therefore, the capacitance values of the first variable capacitance elements included in the first variable capacitance unit 21 are switched at a higher rate than that at which the capacitance values of the second variable capacitance elements included in the second variable capacitance unit 22 are switched.

If the control data is adjusted to control the oscillation frequency of the DCO circuit 11 so as to cause the difference signal between the comparison signal and the reference signal to be stable at a minimum or desired offset value, a signal having a required oscillation frequency can be generated.

Figure 4:
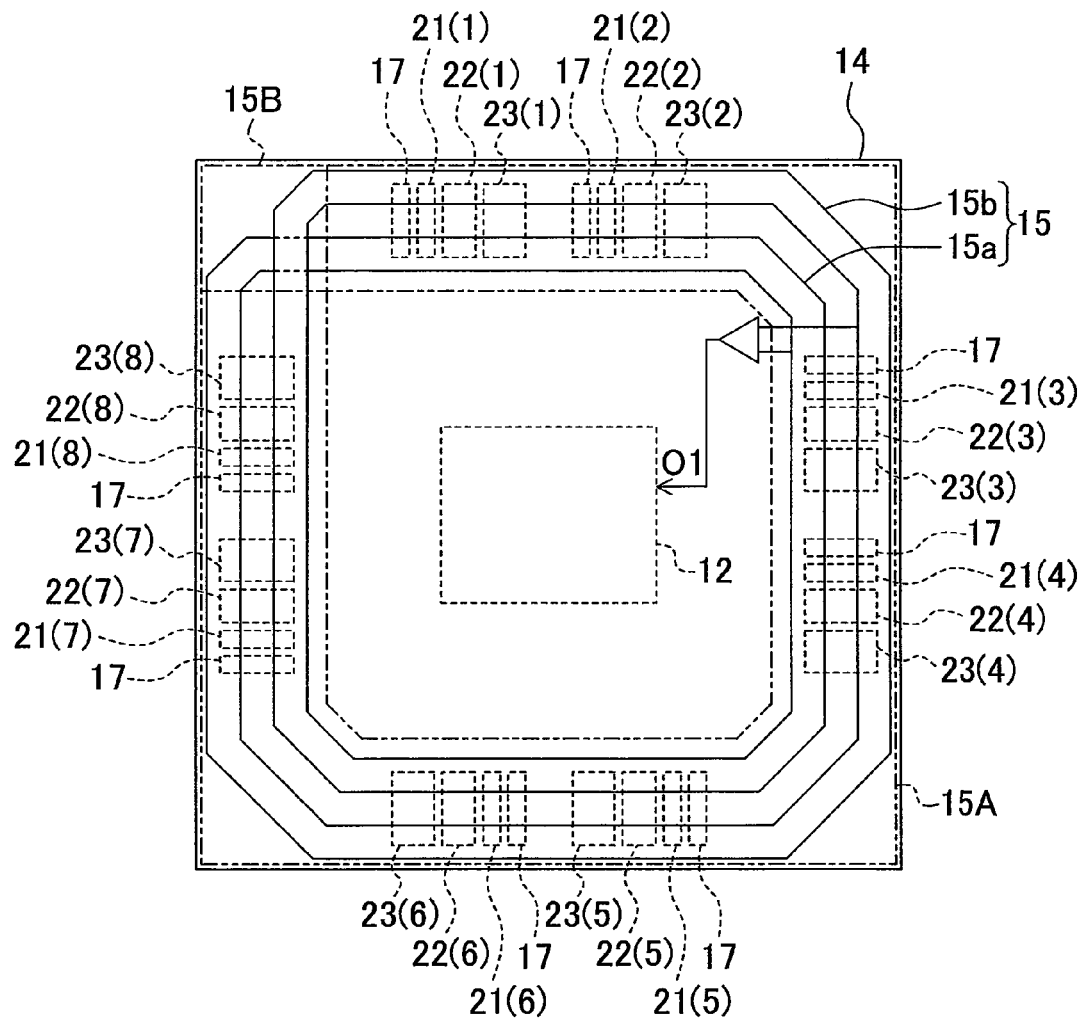
FIG. 4 is a plan view showing a layout of the frequency synthesizer of the first embodiment.

FIG. 4 shows a layout of the frequency synthesizer of the first embodiment. The loop-shaped transmission line path 15 is formed on a semiconductor substrate 14. The transmission line path 15 has an outer shape which is substantially a square shape, and includes a parallel portion 15A in which a first conductor 15a and a second conductor 15b are arranged in parallel to each other, and an intersection portion 15B in which the first conductor 15a and the second conductor 15b intersect while being isolated from each other.

Figure 5:
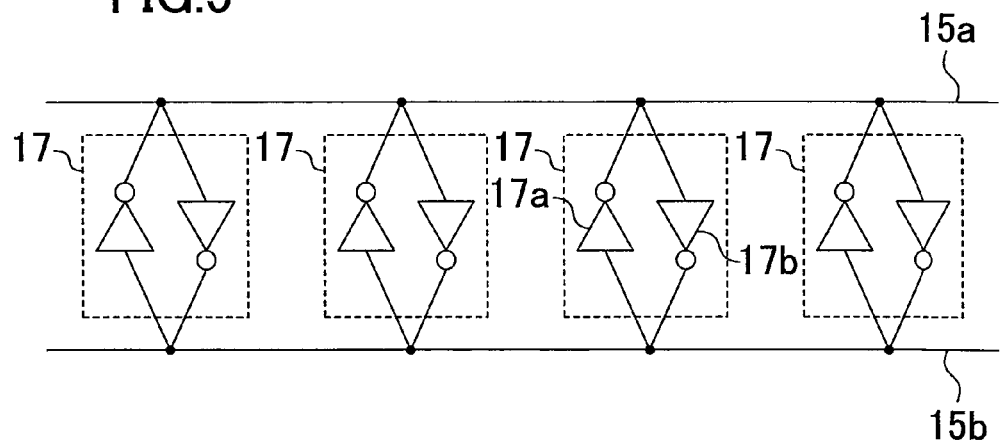
FIG. 5 is a diagram showing an equivalent circuit of an active circuit used in the frequency synthesizer of the first embodiment.

A plurality of active circuits 17 are coupled between the first conductor 15a and the second conductor 15b. Referring to FIG. 5, the active circuits 17 may each be, for example, a circuit in which an inverter 17a and an inverter 17b are connected in parallel and are directed in opposite directions. Although FIG. 4 shows an example in which the active circuits 17 are provided at eight positions on the transmission line path 15, a larger or smaller number of active circuits 17 may be provided.

The first variable capacitance elements included in the first variable capacitance unit 21, the second variable capacitance elements included in the second variable capacitance unit 22, and the third variable capacitance elements included in the third variable capacitance unit 23 are coupled between the first conductor 15a and the second conductor 15b. The first, second and third variable capacitance elements are each divided and arranged into a plurality of blocks.

In FIG. 4, the first variable capacitance elements are divided into eight first variable capacitance element blocks 21(1) to 21(8). The second variable capacitance elements are divided into eight second variable capacitance element blocks 22(1) to 22(8). The third variable capacitance elements are divided into eight third variable capacitance element blocks 23(1) to 23(8).

The numbers of the first, second and third variable capacitance element blocks are each eight above, but may be larger or smaller than eight. Moreover, the numbers of the first, second and third variable capacitance element blocks may not have the same. The number of variable capacitance elements in each variable capacitance element block is not limited, and may vary among the blocks.

The oscillation frequency control unit 12 is provided at a center portion surrounded by the transmission line path 15 of the semiconductor substrate 14. The active circuits 17 and the first, second and third variable capacitance elements are provided in respective regions below the transmission line path 15 of the semiconductor substrate 14. In the case of an inductor included in a typical LC oscillator, a magnetic field is generated in the inductor, and therefore, it is difficult to provide an element in the inductor since they affect each other. However, in the case of the loop-shaped transmission line path of this embodiment, the adjacent conductors generate magnetic fields which cancel each other, so that substantially no magnetic field exist therebetween, and therefore, an element can be provided in a region below the path (see "Rotary Traveling-Wave Oscillator Arrays: A New Clock Technology," IEEE JOURNAL OF SOLID-STATE CIRCUITS, VOL. 36, NO. 11, NOVEMBER 2001). Therefore, the oscillator of the present disclosure can have a smaller area than that of conventional LC oscillators.

Moreover, if the oscillation frequency control unit 12 is provided at the center portion of the inner region surrounded by the transmission line path 15, then even when capacitance elements are distributed and arranged, control lines connecting the oscillation frequency control unit 12 and the variable capacitance elements can have lengths not so largely different from each other or have a uniform length. Therefore, it is possible to reduce the risk of a deterioration in characteristics, such as variations in delay due to a difference in length between control lines, occurrence of unnecessary components due to the delay variations, or the like.

Hereinafter, the variable capacitance unit 20 will be described in detail. The DCO circuit 11 of this embodiment has the variable capacitance unit 20. Therefore, the capacitance component $C_1$ in Expression (2) can be represented by $$C_1 = Cv + Cp \qquad (4)$$

where Cv represents the total sum of the capacitance values in the variable capacitance unit 20, and Cp represents the parasitic capacitances of the active circuits 17 and the like (excluding the variable capacitance unit 20) connected to the transmission line path 15 and the capacitance component of the transmission line path 15 itself.

In this embodiment, the variable capacitance unit 20 includes the first, second and third variable capacitance units 21, 22 and 23. Therefore, Cv can be represented by $$Cv = Cv_1 + Cv_2 + Cv_3 \qquad (5)$$

where $Cv_1$ represents the capacitance value of the first variable capacitance unit 21, $Cv_2$ represents the capacitance value of the second variable capacitance unit 22, and $Cv_3$ represents the capacitance value of the third variable capacitance unit 23. By changing the values of $Cv_1$, $Cv_2$ and $Cv_3$, the oscillation frequency of the DCO circuit 11 can be changed. The oscillation frequency of the DCO circuit 11 can be roughly and finely adjusted by changing the value of $Cv_3$ by a larger amount than those for the values of $Cv_1$ and $Cv_2$.

The first variable capacitance unit 21 includes a plurality of first variable capacitance elements 21a as shown in FIG. 6. The plurality of first variable capacitance elements 21a are each coupled between the first conductor 15a and the second conductor 15b as shown in FIG. 4. Bits of the first control line D1 are connected to the respective corresponding first variable capacitance elements 21a. Also, in the DCO circuit of this embodiment, the first variable capacitance unit 21 is divided into a plurality of first variable capacitance element blocks, and the first variable capacitance element blocks include the first variable capacitance elements 21a. FIG. 6 shows an example in which the first variable capacitance elements 21a are distributed among eight first variable capacitance element blocks 21(1) to 21(8). In FIG. 6, the first control data has 16 bits, and each first variable capacitance element block includes two first variable capacitance elements 21a.

The second and third variable capacitance unit 22 and 23 may have a configuration similar to that of the first variable capacitance unit 21. Note that the number of bits of control data, the number of variable capacitance elements included in each block, or the like may be adjusted as appropriate.

Figure 7A:
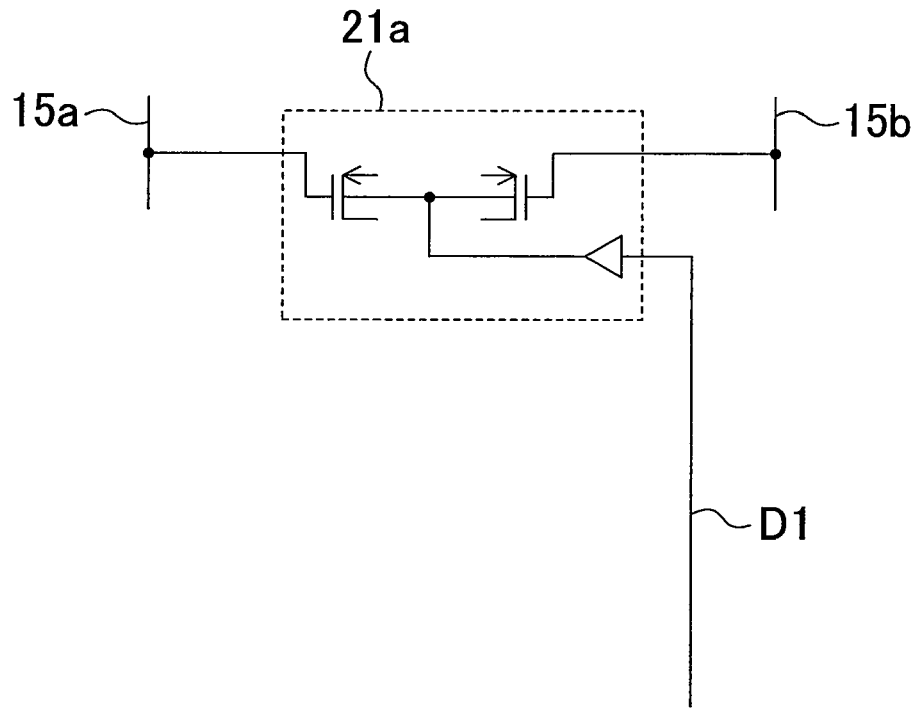
FIG. 7A is a diagram showing an equivalent circuit of an example first variable capacitance element of the frequency synthesizer of the first embodiment.

The first variable capacitance element 21a includes two varactor elements and a buffer element connected to a connection node of the varactor elements, for example, as shown in FIG. 7A. The varactor element has a low capacitance value when a high-level voltage is applied thereto, and has a high capacitance value when a low-level voltage is applied thereto. The varactor element is also connected in series between the first conductor 15a and the second conductor 15b. Therefore, the oscillation frequency of the DCO circuit 11 can be controlled by changing the voltage level of the control line connected to the buffer element to switch the capacitance states of the varactor element and therefore change the capacitance value to the ground of the transmission line path 15.

Figure 7B:
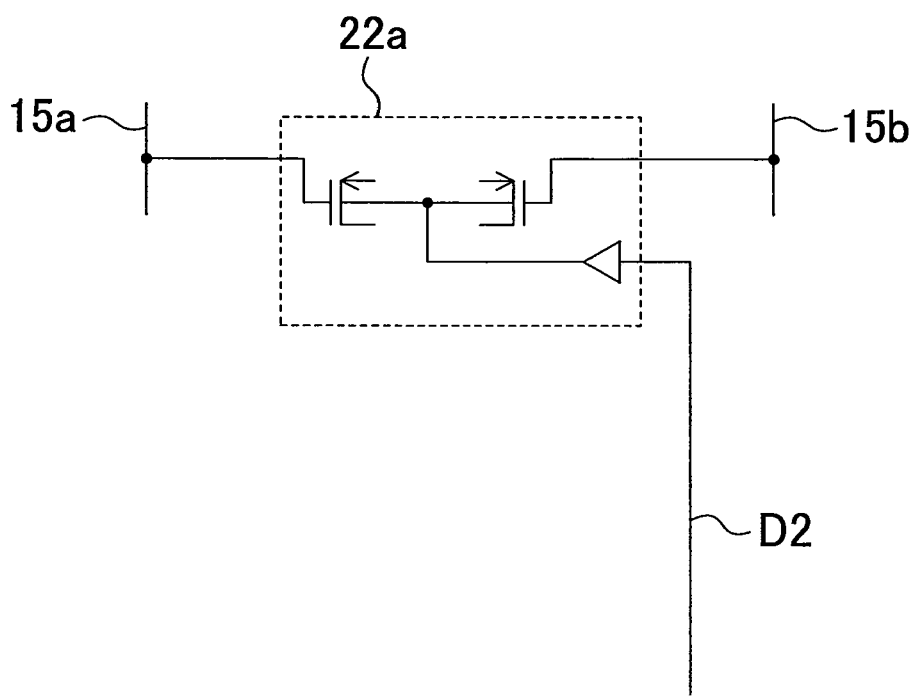
FIG. 7B is a diagram showing an equivalent circuit of an example second variable capacitance element of the frequency synthesizer of the first embodiment.

Referring to FIG. 7B, a second variable capacitance element 22a may include varactor elements and a buffer element as in the first variable capacitance element 21a. Note that the second control data generally has a larger number of bits than that of the first control data. For example, when an input to the first thermometer encoder 38 has 6 bits, the second control data has 64 bits. When the input has 8 bits, the second control data has 256 bits.

Figure 8:
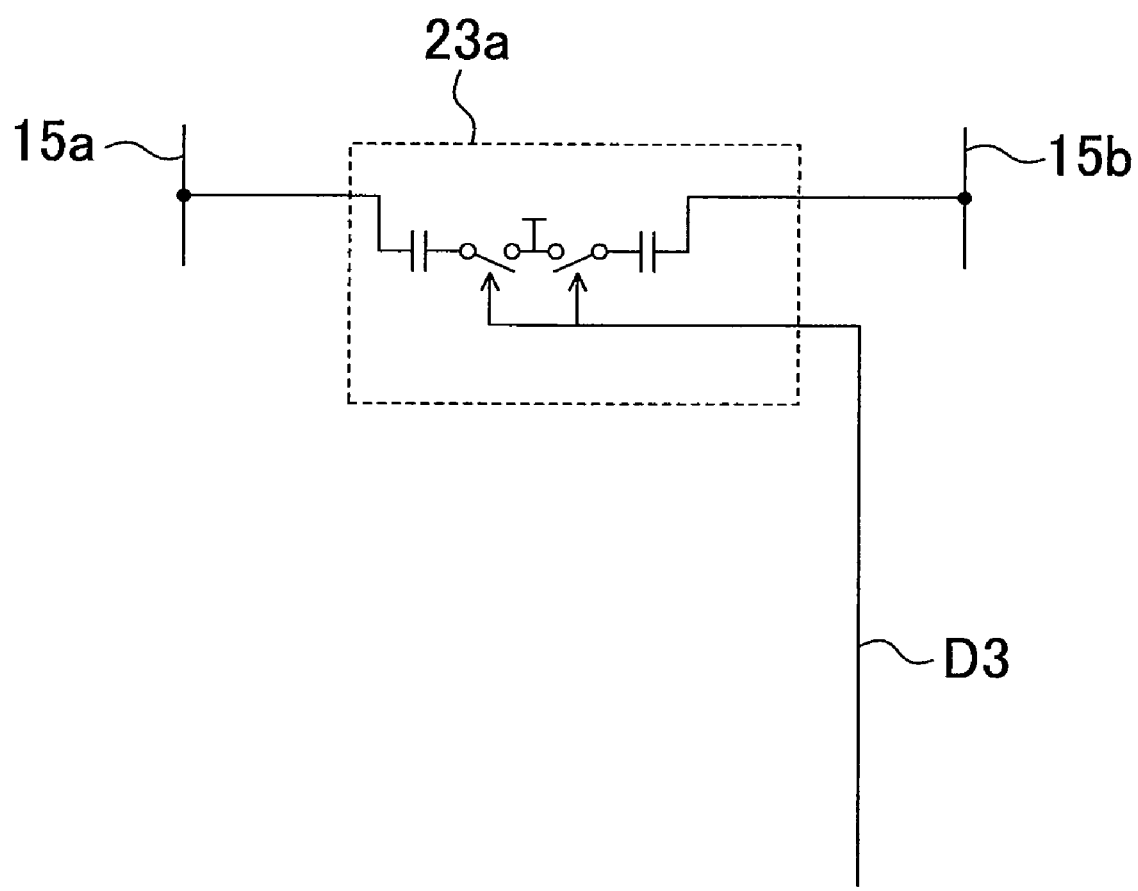
FIG. 8 is a diagram showing an equivalent circuit of an example third variable capacitance element of the frequency synthesizer of the first embodiment.

Referring to FIG. 8, a third variable capacitance element 23a may be caused to be variable by changing connections of capacitance elements using switches. In this case, if the third variable capacitance element 23a has a metal oxide film metal (MOM) structure, a metal insulating film metal (MIM) structure or the like, the third variable capacitance element 23a can have a high capacitance value per unit area. Therefore, the area of the third variable capacitance element 23a can be reduced. For example, the third variable capacitance element 23a may include a varactor element having a large gate size which has a small ratio of the area of the peripheral region to the area of the gate.

The capacitance value $Cv_1$ of the first variable capacitance unit 21 and the capacitance value $Cv_2$ of the second variable capacitance unit 22 have the same change amount with respect to a single clock change. $\Sigma\Delta$ modulation may be used so as to finely change the temporal average value of $Cv_1$. If a digital signal is over-sampled using a sufficiently high-frequency clock, requantization noise can be distributed in a wide band, resulting in a noise shaping effect, which serves as a kind of high-pass filter due to its differentiation characteristics. Therefore, $\Sigma\Delta$ modulation has an effect of shifting quantization noise to high-frequency components. On the other hand, the same temporal average value as that of the original data can be obtained. For example, it is assumed that decimal numbers 5, 4, 6, 7, 4, 7, 7 and 5 (control data) are output during a predetermined clock period, and a corresponding number of first variable capacitance elements 21a are caused to be in the high capacitance state. In this case, the average number of first variable capacitance elements 21a which are caused to be in the high capacitance state during the predetermined clock period is 5.625. Thus, by discretely changing the value of $Cv_1$, an average capacitance value during a predetermined period of time can be set in units of a value smaller than the capacitance change amount of a single first variable capacitance element 21a.

Thus, the capacitance value can be controlled with high accuracy by using $\Sigma\Delta$ modulation. However, although quantization noise is reduced by the noise shaping effect particularly for low frequencies, but still occurs. Hereinafter, a principle based on which the DCO circuit and the frequency synthesizer of this embodiment can reduce quantization noise by $\Sigma\Delta$ modulation will be described.

A minimum frequency change amount $\Delta f_{res1}$ of the DCO circuit 11 of this embodiment can be represented as described below. Firstly, a relationship between the capacitance change amount and the frequency change amount can be represented by $$\frac{\partial f_0}{\partial C_1} = \frac{1}{2\sqrt{L_1 C_1^3}} = \frac{f_0}{C_1} \tag{6}$$

which is obtained by differentiating Expression (2) with respect to the capacitance $C_1$.

Let $\Delta Cv_{min}$ be the minimum capacitance change amount of the variable capacitance unit. The minimum frequency change amount $\Delta f_{res1}$ can be represented by $$\Delta f_{res1} = \frac{\partial f_0}{\partial C_1} \cdot \Delta Cv_{min} = \frac{f_0}{C_1} \cdot \Delta Cv_{min} \tag{7}$$

On the other hand, in the case of a DCO circuit employing a conventional LC oscillator, a minimum frequency change amount $\Delta f_{res2}$ can be similarly represented, using Expression (3), by $$\Delta f_{res2} = \frac{\partial f_0}{\partial C_2} \cdot \Delta Cv_{min} = \frac{f_0}{C_2} \cdot \Delta Cv_{min} \tag{8}$$

Expressions (7) and (8) represent mathematically similar relationships. However, comparison of Expressions (2) and (3) yields with respect to the same frequency $f_0$ $$\frac{1}{2\sqrt{L_1 C_1}} = \frac{1}{2\pi\sqrt{L_2 C_2}} \tag{9}$$

Therefore, a relationship between $C_1$ and $C_2$ is represented by $$C_1 = \pi^2 \cdot \frac{L_2}{L_1} \cdot C_2 \tag{10}$$

When $L_1 = L_2$, Expression (10) yields $$C_1 = \pi^2 \cdot C_2 \tag{11}$$

Substituting this into Expression (7) yields $$\Delta f_{res1} = \frac{f_0}{\pi^2 C_2} \cdot \Delta Cv_{min} = \frac{\Delta f_{res2}}{\pi^2} \tag{12}$$

Therefore, when $L_1 = L_2$, the minimum frequency change amount $\Delta f_{res1}$ of the DCO circuit 11 of this embodiment is $1/\pi^2$ (about 1/10) of the minimum frequency change amount $\Delta f_{res2}$ of a conventional LC oscillator.

On the other hand, the quantization noise can be represented by $$L_n(\Delta f) = \frac{1}{12} \cdot \left(\frac{\Delta f_{res}/2^W}{\Delta f}\right)^2 \cdot \frac{1}{f_{dth}} \cdot \left(\text{sinc}\left(\frac{\Delta f}{f_{dth}}\right)\right)^2 + \\ \frac{1}{12} \cdot \left(\frac{\Delta f_{res}}{\Delta f}\right)^2 \cdot \frac{1}{f_{dth}} \cdot \left(2\sin\left(\frac{\pi \Delta f}{f_{dth}}\right)\right)^{2n} \tag{13}$$

where $L_n(\Delta f)$ represents a phase noise level at a frequency component at a distance of a frequency $\Delta f$ from the oscillation frequency, $\Delta f_{res}$ represents a minimum frequency change amount which can be changed in accordance with the first control signal D1, W represents the number of input bits with respect to $\Sigma\Delta$ modulation, $f_{dth}$ represents the clock frequency of $\Sigma\Delta$ modulation, and n represents the order of $\Sigma\Delta$ modulation.

A relationship between quantization noise $L_{n1}$ in the frequency synthesizer employing the DCO circuit of this embodiment and quantization noise $L_{n2}$ in a frequency synthesizer employing a conventional LC oscillator under the same conditions except for the minimum frequency change amount in Expression (13), is represented by $$L_{n1}(\Delta f) = \frac{L_{n2}(\Delta f)}{\pi^4} \quad (14)$$

Specifically, the quantization noise in the frequency synthesizer employing the DCO circuit of this embodiment is about 1/100 of the quantization noise in the frequency synthesizer employing a conventional LC oscillator, which means a reduction by about 20 dB in terms of logarithm.

In order to reduce the minimum capacitance change amount $\Delta Cv_{min}$ of the variable capacitance unit, it is necessary to reduce the size of the varactor element or the like. However, there is a limit of miniaturization of a semiconductor integrated circuit in terms of fabrication. Therefore, it has been difficult to reduce quantization noise by reducing the size of the varactor element in conventional LC oscillators. However, in the synthesizer employing the DCO circuit of this embodiment, quantization noise is about 1/100 of that of the conventional one when $\Delta Cv_{min}$ is the same. Therefore, the synthesizer employing the DCO circuit of this embodiment is considerably effective to a reduction in quantization noise.

The DCO circuit of this embodiment can increase the capacitance value as compared to an LC oscillator when the oscillation frequency is the same. Therefore, a varactor element having a larger size than that of the LC oscillator can be used, and therefore, it is advantageously easier to form the varactor element. On the other hand, if the size of the varactor element is increased, the area of the variable capacitance unit is likely to increase. However, in the DCO circuit of this embodiment, the variable capacitance element can be formed below the transmission line path 15, and therefore, an increase in the overall area of the variable capacitance unit can be prevented, i.e., does not raise a significant problem.

Moreover, if the capacitance value $Cv_3$ of the third variable capacitance unit 23 for rough adjustment is larger than the capacitance value $Cv_1$ of the first variable capacitance unit 21 and the capacitance value $Cv_2$ of the second variable capacitance unit 22, and the third variable capacitance unit 23 includes variable capacitance elements having a large unit capacitance value, then even when the value of Cv is large, the increase of the area can be suppressed. In addition, by increasing the value of the inductor, the capacitance value of the variable capacitance unit can be suppressed to a range within which the quantization noise can be reduced and the area does not significantly increase.

In the DCO circuit of this embodiment, the first variable capacitance elements 21a included in the first variable capacitance unit 21 are divided into the eight first variable capacitance element blocks 21(1) to 21(8), which are distributed and arranged, as shown in FIG. 4. The second variable capacitance unit 22 and the third variable capacitance unit 23 are also each divided into a plurality of blocks.

The first, second and third variable capacitance units 21, 22 and 23 may not be divided and may be concentrated. However, as shown in FIG. 4, if the first, second and third variable capacitance units 21, 22 and 23 are divided into a plurality of blocks, which are distributed and arranged, it is possible to reduce noise by switching the variable capacitance units as described below.

Figure 9:
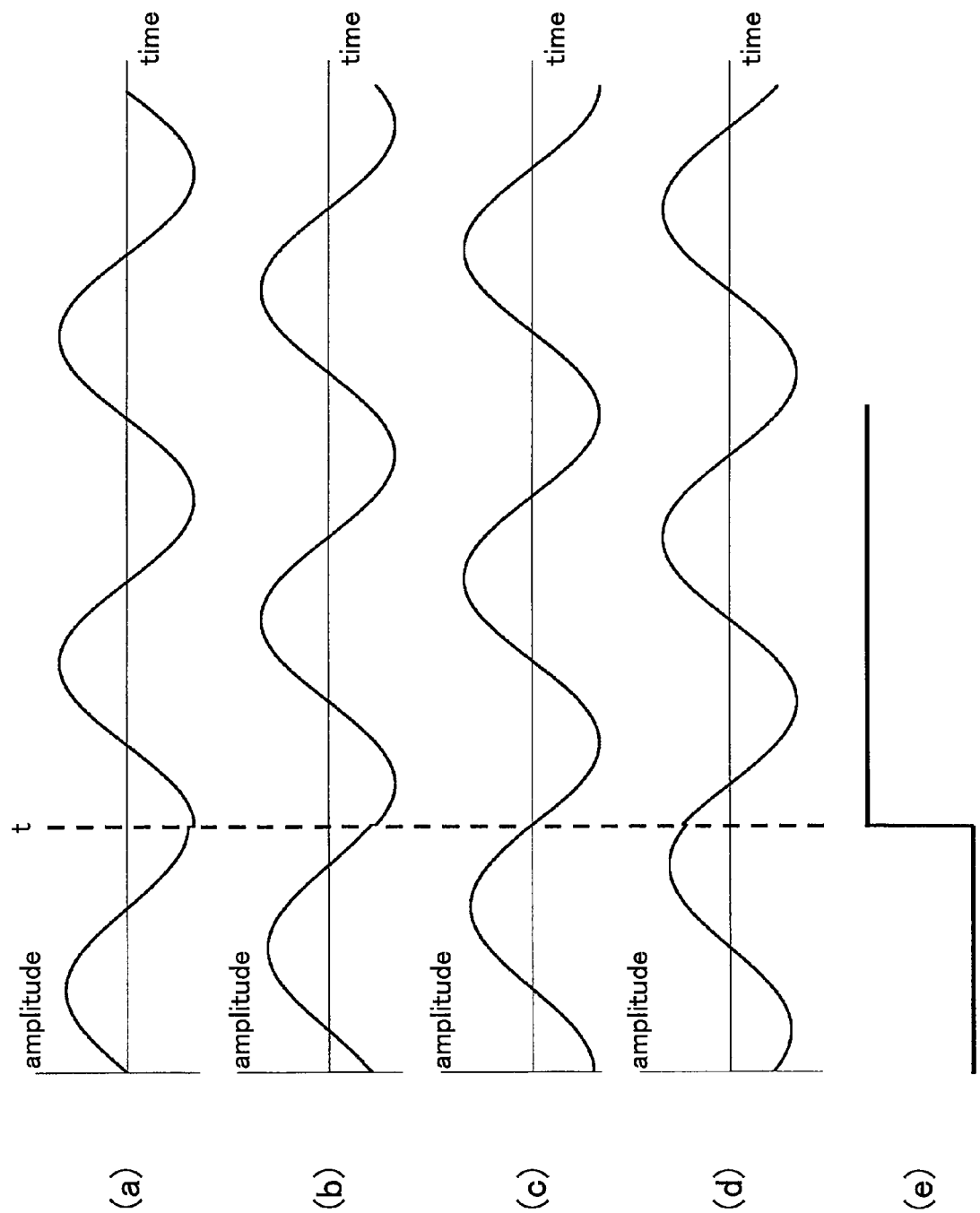
FIG. 9 is a graph showing amplitude waveforms in the frequency synthesizer of the first embodiment.

Portions (a) to (d) of FIG. 9 show oscillation waveforms at positions on the transmission line path 15. A portion (e) of FIG. 9 shows a change in the first control data. Note that the portion (a) of FIG. 9 shows a waveform at a position where the first variable capacitance element block 21(1) is provided. The portion (b) of FIG. 9 shows a waveform at a position where the first variable capacitance element block 21(3) is provided. The portion (c) of FIG. 9 shows a waveform at a position where the first variable capacitance element block 21(5) is provided. The portion (d) of FIG. 9 shows a waveform at a position where the first variable capacitance element block 21(7) is provided. Although the waveform may be actually close to a rectangular wave rather than a sine wave, a sine waveform is shown for the sake of convenience for description.

At timing t, the first control data is changed so that a control voltage for the first variable capacitance elements 21a included in the first variable capacitance element blocks 21(1) to 21(8) transitions from the low level to the high level. In this case, at a position where the first variable capacitance element block 21(1) is provided, a change occurs at a peak of the waveform, where a large amount of electric charge is charged or discharged, whereby a ratio ($\Delta q/\Delta C$) of a change in amplitude $\Delta V$ (i.e., a change in electric charge) to a change in capacitance is large. Therefore, a change in amplitude during switching appears as a phase noise degradation. At positions where the first variable capacitance element blocks 21(3) and 21(7) are provided, a change occurs out of a peak of the waveform, so that the amplitude change $\Delta V$ is slightly smaller, but a phase noise degradation still occurs. On the other hand, at a position where the first variable capacitance element block 21(5) is provided, a change occurs at a center of the waveform, so that there is substantially no change in amplitude.

Thus, a phase noise degradation due to switching of the capacitance states occurs, depending on a position where the capacitance states of the first variable capacitance element are switched. Such a phase noise degradation also occurs in a frequency synthesizer employing a conventional LC oscillator. The conventional frequency synthesizer is provided with a delay adjusting circuit for suppressing the phase noise. The amount of a delay in a dithering clock for driving a $\Sigma\Delta$ modulation circuit is adjusted by the delay adjusting circuit so that the switching is performed at a center of the waveform. The delay adjusting circuit includes multiple inverters, a current adjusting circuit or the like. Therefore, the area and current consumption of the delay adjusting circuit raise problems with a reduction in size and power consumption of the frequency synthesizer.

On the other hand, in the frequency synthesizer employing the DCO circuit of this embodiment, positions where the switching of the capacitance states is performed are distributed, whereby phase noise can be reduced without providing a delay adjusting circuit. For example, an optimal order of the positions where the switching of the capacitance states is performed may be previously determined so that the positions are distributed. For example, the switching is performed in the first variable capacitance element block 21(1) at the first clock of $\Sigma\Delta$ modulation, the switching is performed in 21(4) at the second clock, and the switching is performed successively in 21(7), 21(2), 21(5), 21(8), 21(3) and 21(6) at the third clock and thereafter. At the ninth clock, the switching is performed in 21(1) again. Thus, the positions where the switching of the capacitance states is performed are distributed, whereby phase noise can be reduced.

Instead of performing the switching of the capacitance states in a predetermined order, a variable capacitance element block which performs the switching may be randomly determined. In this case, the capacitance values are not uniform in terms of position, depending on the timing. Despite this, the total sum $Cv_1$ of the capacitance values of the first variable capacitance unit 21 is typically sufficiently smaller than the total sum $Cv_2$ of the capacitance values of the second variable capacitance unit 22 and the total sum $Cv_3$ of the capacitance values of the third variable capacitance unit 23, and therefore, the influence of the non-uniformity of the capacitance values is not significant.

Although there is a single variable capacitance element block which performs the switching in the aforementioned example, two or more variable capacitance element blocks may perform the switching as long as the switching can be performed in a distributed manner in the whole circuit.

Also in the second variable capacitance unit 22, the capacitance states of the second variable capacitance elements 22a may be similarly performed in an order which prevents the non-uniformity, or at random.

Also, the capacitance state is changed from the high capacitance state to the low capacitance state in a manner which prevents operations from concentrating at a constant position (random operations). After the capacitance state of the second capacitance element is changed to the low capacitance state in all the blocks with respect to the first bit, the switching may be next similarly performed successively with respect to the second bit in a manner which prevents the non-uniformity. Moreover, if the switching is performed in a successive or random manner which prevents the non-uniformity with respect to the third bit, the fourth bit and so on, the value of a change in capacitance due to a single piece of control data can be minimized while suppressing the non-uniformity of the whole capacitance distribution to a small level.

In FIG. 4, as an example, the first, second and third variable capacitance units 21, 22 and 23 are each divided into eight blocks. The first, second and third variable capacitance units 21, 22 and 23 may each be divided into any number of blocks. Note that as the number of blocks is increased and the blocks are more uniformly distributed, the noise reducing effect increases. Moreover, although the first, second and third variable capacitance units 21, 22 and 23 are each divided into the same number of blocks, the present disclosure is not limited to this. Alternatively, only the first variable capacitance unit 21 may be divided into blocks, or the first and second variable capacitance units 21 and 22 may be divided, while the third variable capacitance unit may be concentrated and arranged at a single position, for example.

Figure 10:
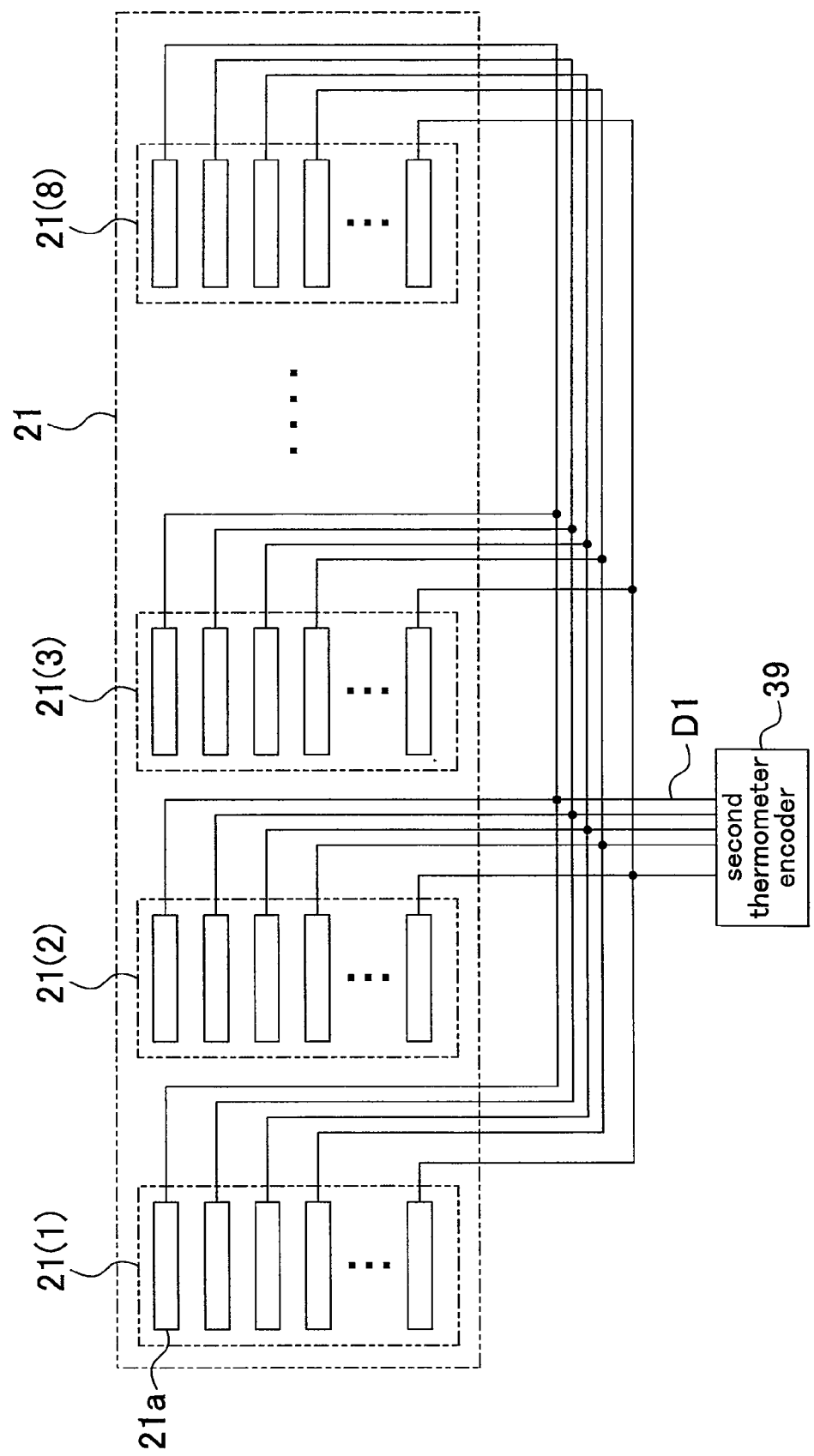
FIG. 10 is a block diagram showing an example first variable capacitance unit of the frequency synthesizer of the first embodiment.

Moreover, for the first variable capacitance unit 21, the first variable capacitance elements 21a included in the blocks may be operated in associated with each other. For example, referring to FIG. 10, the first variable capacitance element blocks 21(1) to 21(8) each include a single first variable capacitance element 21a which is controlled in accordance with the first bit of the first control signal. Similarly, the first variable capacitance element blocks 21(1) to 21(8) each include first variable capacitance elements 21a which is controlled in accordance with the second, third, . . . , and n-th bits (one first variable capacitance element 21a for each bit). With such a configuration, signals having separate phases can be switched while achieving a completely balanced capacitance distribution. Therefore, a noise degradation due to the phase switching can be significantly reduced. Note that, in this configuration, the capacitance states of a plurality of first variable capacitance elements 21a are simultaneously switched, resulting in a large change in minimum capacitance. For example, when the first variable capacitance unit 21 is divided into eight first variable capacitance element blocks as shown in FIG. 4, a capacitance change amount which is eight times as large as that of the first variable capacitance element 21a is a minimum capacitance change amount. Therefore, a change in frequency $\Delta f_{res1}'$ in this case is represented by Expression (15). The effect of reducing the minimum frequency change amount is smaller, and therefore, this case is less effective to quantization noise, as compared to the above cases.

$$\Delta f_{res1}' = \frac{8 \cdot \Delta f_{res2}}{\pi^2} \quad (15)$$

The second and third variable capacitance units 22 and 23 can have a similar configuration. In particular, the capacitance value of the third variable capacitance unit 23 has a large portion of the overall capacitance value of the variable capacitance unit 20. Therefore, the simultaneous operation is more preferable so as to eliminate the non-uniformity.

The third variable capacitance unit 23 may include variable capacitance elements having different capacitance values instead of variable capacitance elements having the same capacitance value. For example, the capacitance value of a variable capacitance element connected to the second bit of the third control line D3 may be twice as large as the capacitance value of a variable capacitance element connected to the first bit. The capacitance value of a variable capacitance element connected to the third bit may be twice as large as the capacitance value of the variable capacitance element connected to the second bit. The capacitance values of variable capacitance elements connected to the fourth bit and thereafter are each similarly doubled with respect to the previous bit. In this case, the frequency can be roughly changed by manipulating the higher-order bits of the third control line D3, and the frequency can be finely changed by manipulating the lower-order bits.

When the third variable capacitance unit 23 has such a configuration, variable capacitance elements connected to the lower-order bits which share a small portion of the overall capacitance value of the variable capacitance unit 20 may be operated on a block-by-block basis (i.e., the blocks operate independently of each other).

The first and second variable capacitance units 21 and 22 preferably include variable capacitance elements having the same value so that the first and second variable capacitance elements 21a and 22a have the same capacitance change amount, thereby obtaining the linearity of a change in capacitance. However, the second variable capacitance unit 22 can include variable capacitance elements having different values as in the third variable capacitance unit 23.

For example, variable capacitance elements having the same capacitance change amount as that of the first variable capacitance element 21a are connected to the low-order bits of the second control line D2, while variable capacitance elements having an integral multiple of the capacitance change amount of the first variable capacitance element 21a are connected to the high-order bits thereof.

As a specific example, it is assumed that the second variable capacitance unit 22 includes seven variable capacitance elements each having a capacitance change amount of $\Delta C2a$, and seven variable capacitance elements each having a capacitance change amount of $8 \times \Delta C2a$. In this case, the fourteen capacitance elements can provide 64 capacitance values, where the difference between each capacitance value is $\Delta C2a$. Therefore, the number of the second variable capacitance elements 22a can be reduced without sacrificing the liniearity.

The number of control lines can also be reduced. A single second variable capacitance element 22a may be driven for the lower-order bits of the second control line D2, while a plurality of second variable capacitance elements 22a may be driven for the higher-order bits. In this case, although the number of variable capacitance elements cannot be reduced, the number of control lines can be reduced.

Variation of First Embodiment

Figure 11:
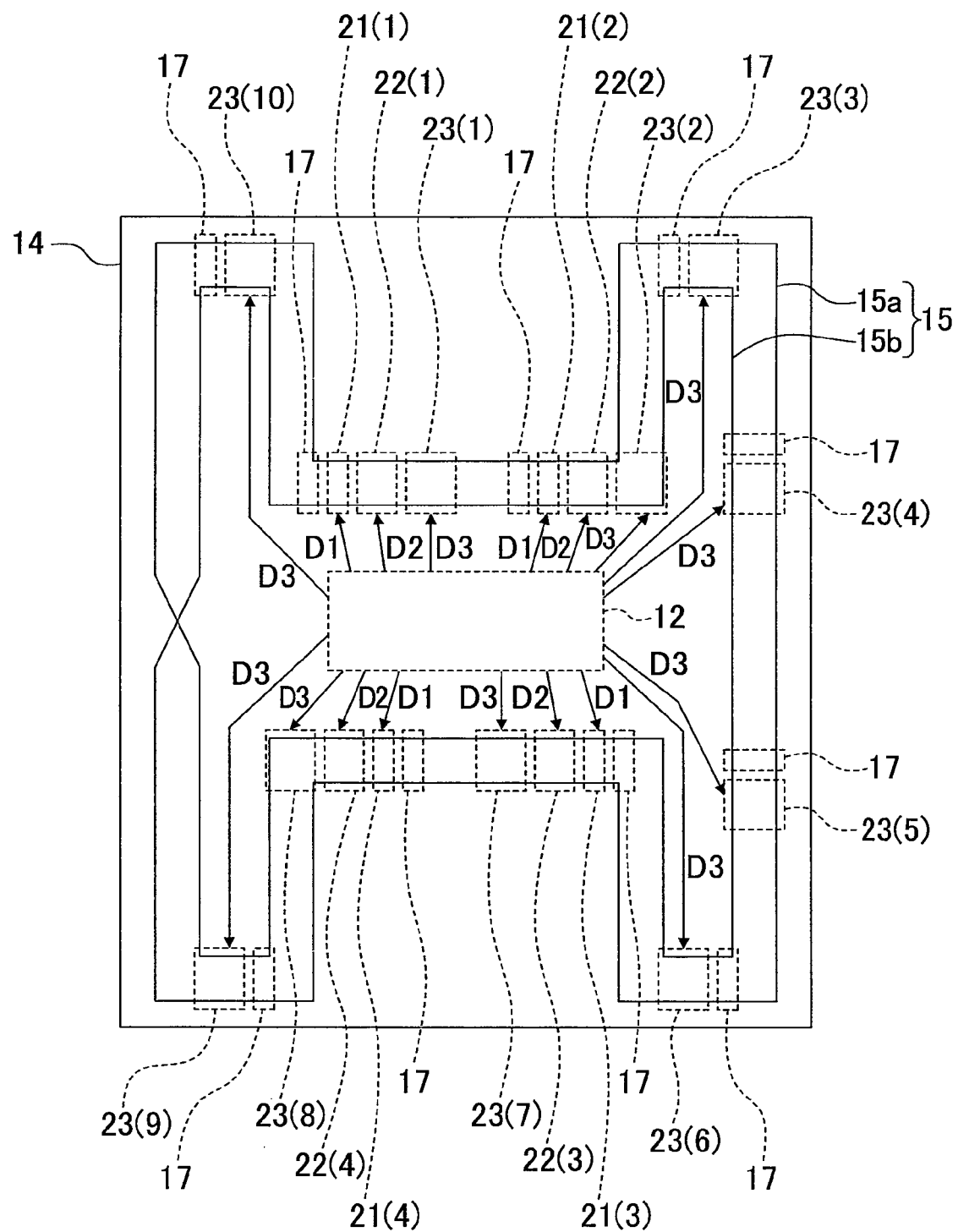
FIG. 11 is a plan view showing a layout of a frequency synthesizer according to a variation of the first embodiment.

Hereinafter, a variation of the first embodiment will be described with reference to the drawings. FIG. 11 shows a layout of a frequency synthesizer according to the variation of the first embodiment. In FIG. 11, the same components as those of FIG. 4 are indicated by the same reference numerals and will not be described.

As shown in FIG. 11, this variation has a transmission line path 15 having a plurality of bent portions which provide an H-shape having convex portions and concave portions. Therefore, the transmission line path 15 is constricted at a center portion thereof, where a gap between two sides facing each other thereof is small.

Third variable capacitance elements 23a included in a third variable capacitance unit 23 for rough adjustment are divided into ten blocks. Second variable capacitance elements 22a included in a second variable capacitance unit 22 for fine adjustment and first variable capacitance elements 21a included in a first variable capacitance unit 21 which is subjected to $\Sigma\Delta$ modulation are each divided into four blocks. Moreover, the third variable capacitance element blocks 23(1) to 23(10) are distributed and arranged in regions on the transmission line path 15 so that a balanced capacitance distribution is provided, while the second variable capacitance blocks 22(1) to 22(4) and the first variable capacitance element blocks 21(1) to 21(4) are concentrated and arranged at the center portion where the transmission line path 15 is constricted. Therefore, the lengths of first control lines D1 connected to the first variable capacitance unit 21 which are operated at a high speed by $\Sigma\Delta$ modulation can be reduced. As a result, the amount of a delay of a control signal can be reduced. Moreover, if the first control lines D1 have lengths not so largely different from each other or a uniform length, variations in delay amount can be reduced. In this case, a deterioration in characteristics, such as occurrence of unnecessary components due to the delay amount and its variations or the like, can be prevented.

Although FIG. 11 shows the H-shaped transmission line path 15, the transmission line path 15 may be in any shape in which there are a portion where an oscillation frequency control unit 12 provided on the transmission line path 15 is close to the transmission line path 15 and a portion where the oscillation frequency control unit 12 is distant from the transmission line path 15, and for example, may be in the shape of an ellipse, a rectangle or the like. Note that, if a plurality of bent portions are provided, a long transmission line path 15 can be easily provided. In this case, the transmission line path 15 may be in the shape of a star, a cross, a comb having a plurality of convex and concave portions, or the like. Moreover, the transmission line path 15 preferably has a symmetrical outer shape. In this case, the first control lines D1 which are operated at a high speed can be easily shortened while having lengths not so largely different from each other or a uniform length. Therefore, the risk of a deterioration in characteristics, such as a delay amount or its variations due to the lengths of control lines or their non-uniformity, occurrence of its accompanying unnecessary components or the like, can be prevented.

Second Embodiment

Figure 12:
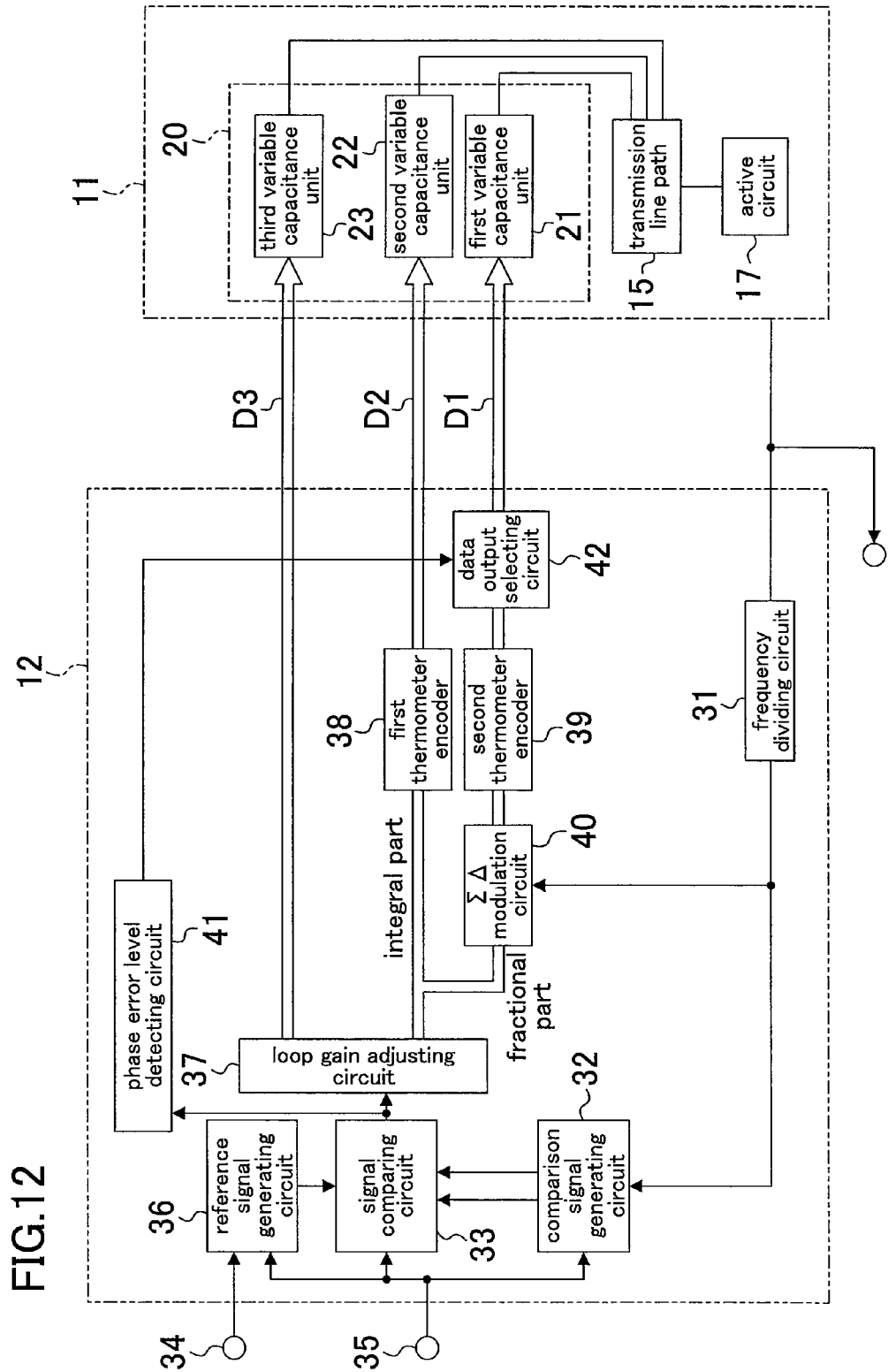
FIG. 12 is a block diagram showing a frequency synthesizer according to a second embodiment.

Hereinafter, a second embodiment of the present disclosure will be described with reference to the drawings. FIG. 12 shows a block configuration of a frequency synthesizer according to the second embodiment. In FIG. 12, the same components as those of FIG. 3 are indicated by the same reference numerals and will not be described.

As shown in FIG. 12, an oscillation frequency control unit 12 of this embodiment includes a phase error level detecting circuit 41 for detecting a phase error level, and a data output selecting circuit 42 for selecting a first variable capacitance element block which supplies first control data, depending on the detected phase error level.

Figure 13:
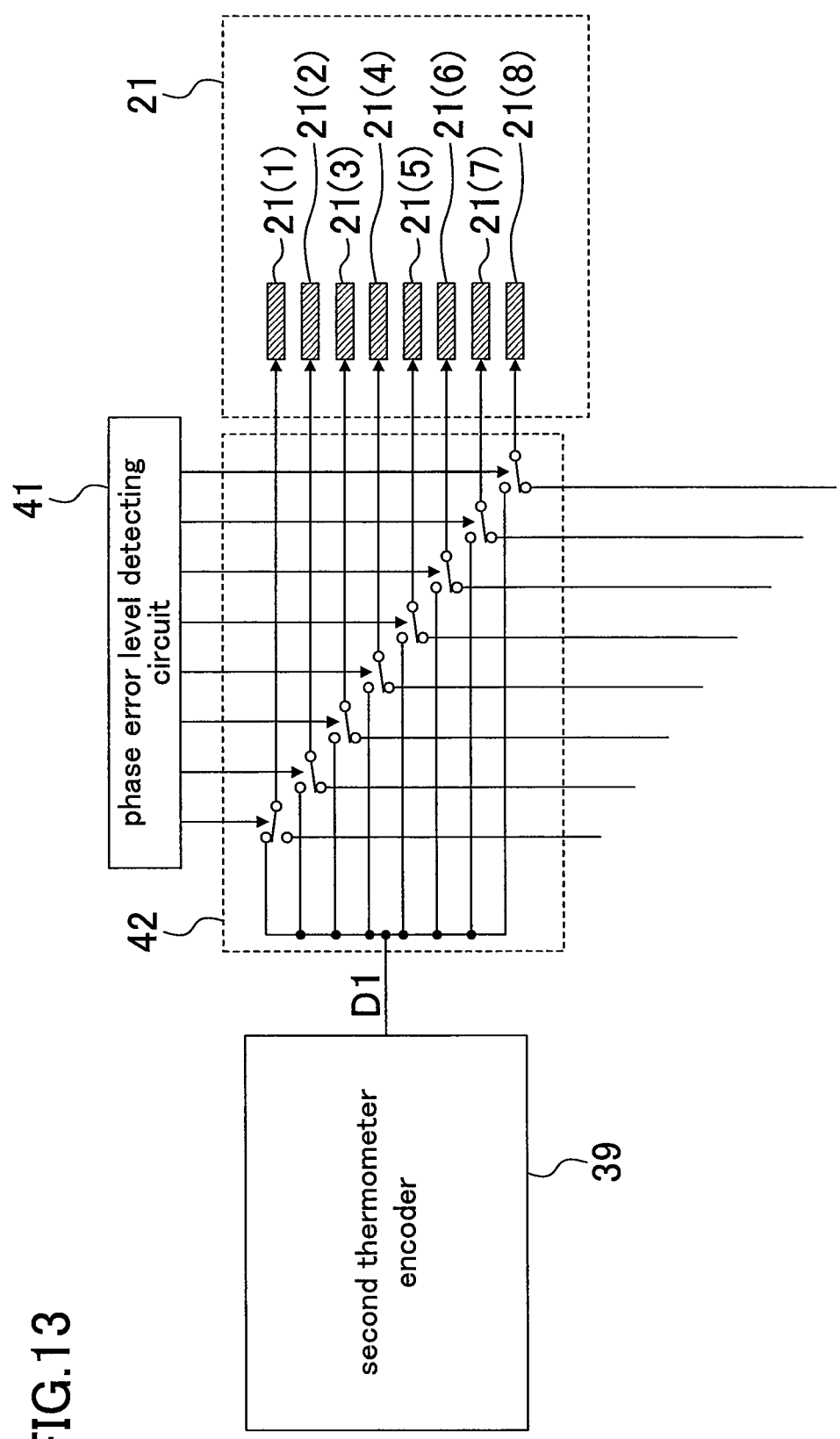
FIG. 13 is a diagram showing an equivalent circuit of an example data output selecting circuit of the frequency synthesizer of the second embodiment.

The phase error level detecting circuit 41 receives an output of a signal comparing circuit 33, and outputs switch data corresponding to the phase error level. Referring to FIG. 13, the data output selecting circuit 42 includes a plurality of switches which are driven based on the switch data output by the phase error level detecting circuit 41, and selects a capacitance element block corresponding to the switch data.

The phase error level detecting circuit 41 has a detection sequence and a stationary sequence. In the detection sequence, first variable capacitance element blocks 21(1) to 21(8) are successively selected. As a result, first control data output from the second thermometer encoder 39 is supplied to a selected one of the first variable capacitance element blocks. Therefore, a position where a first variable capacitance element block having a lowest phase error level is present is detected.

In the stationary sequence, the first variable capacitance element block which has been detected in the detection sequence and has a smallest influence on phase noise is selected and operated.

Data from the other data lines is supplied to the non-selected blocks other than the block selected by the data output selecting circuit 42. The data supplied to the non-selected blocks may be fixed data so that the non-selected blocks may be used as fixed capacitances. In this case, the non-selected blocks may be operated along with the second variable capacitance unit 22, and may be used as a portion of the second variable capacitance unit 22.

The frequency synthesizer of this embodiment generates the switch data for controlling the data output selecting circuit 42 based on a phase error of the frequency synthesizer. However, the switch data may be generated based on a signal supplied from the outside of the frequency synthesizer. For example, when the frequency synthesizer is incorporated into a radio communication device, the switch data may be generated based on the quality (a noise level, modulation accuracy, demodulation accuracy or the like) of a signal after frequency conversion of a received or transmit signal, and the data output selecting circuit 42 may be controlled so that the signal quality is maximized.

Figure 14A:
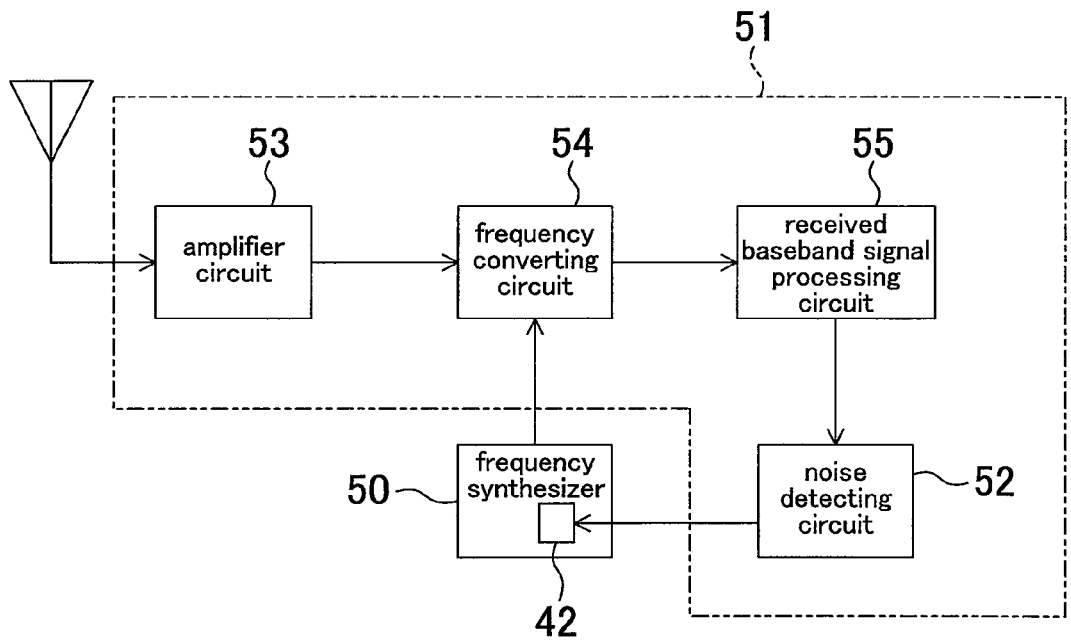
FIGS. 14A and 14B are block diagrams showing radio communication devices according to the second embodiment.

For example, referring to FIG. 14A, when a frequency synthesizer 50 having the data output selecting circuit 42 is combined with a receiver circuit 51, a noise detecting circuit 52 may be provided in the receiver circuit 51, and the data output selecting circuit 42 may be controlled based on a noise level detected by the noise detecting circuit 52. The receiver circuit 51 is, for example, configured to amplify a received signal using an amplifier circuit 53, subject the resultant signal to frequency conversion into a received baseband signal using a frequency converting circuit 54, and subject the received baseband signal to signal processing using a received baseband signal processing circuit 55. In this case, the noise detecting circuit 52 may detects a noise level of the signal processed by the received baseband signal processing circuit 55, and the data output selecting circuit 42 may be controlled so that the noise level is minimized.

Figure 14B:
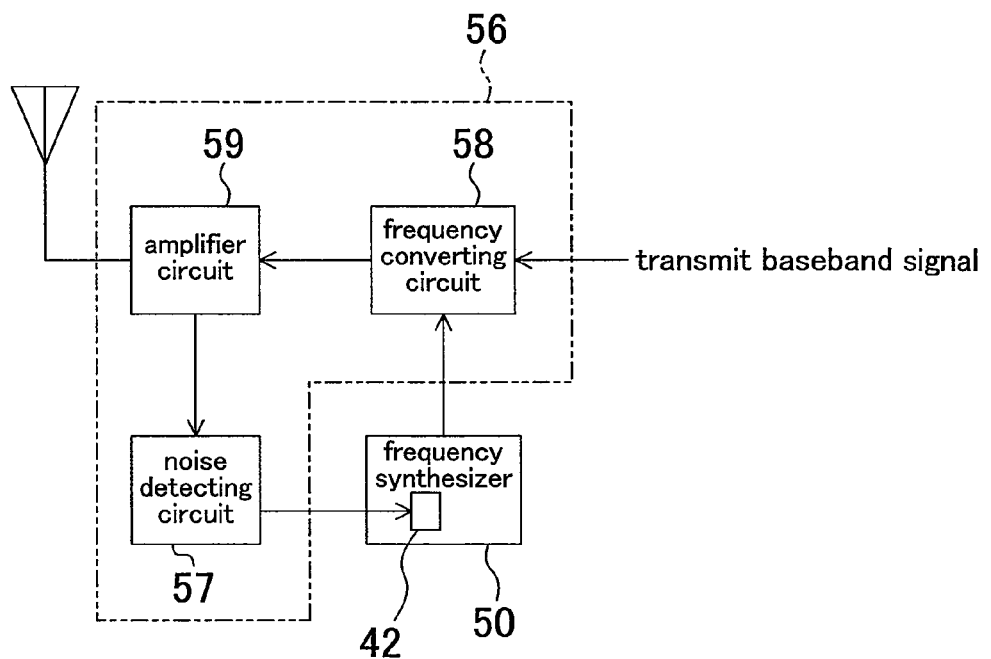

Also, referring to FIG. 14B, when the frequency synthesizer 50 including the data output selecting circuit 42 is combined with a transmitter circuit 56, a noise detecting circuit 57 may be provided in the transmitter circuit 56, and the data output selecting circuit 42 may be controlled based on a noise level detected by the noise detecting circuit 57. The transmitter circuit 56 is, for example, configured to subject a transmit baseband signal to frequency conversion using a frequency converting circuit 58, amplify the resultant signal using an amplifier circuit 59, and transmit the resultant signal. The noise detecting circuit 57 may detect a noise level of the signal amplified by the amplifier circuit 59, and the data output selecting circuit 42 may be controlled so that the noise level is minimized.

Third Embodiment

Figure 15:
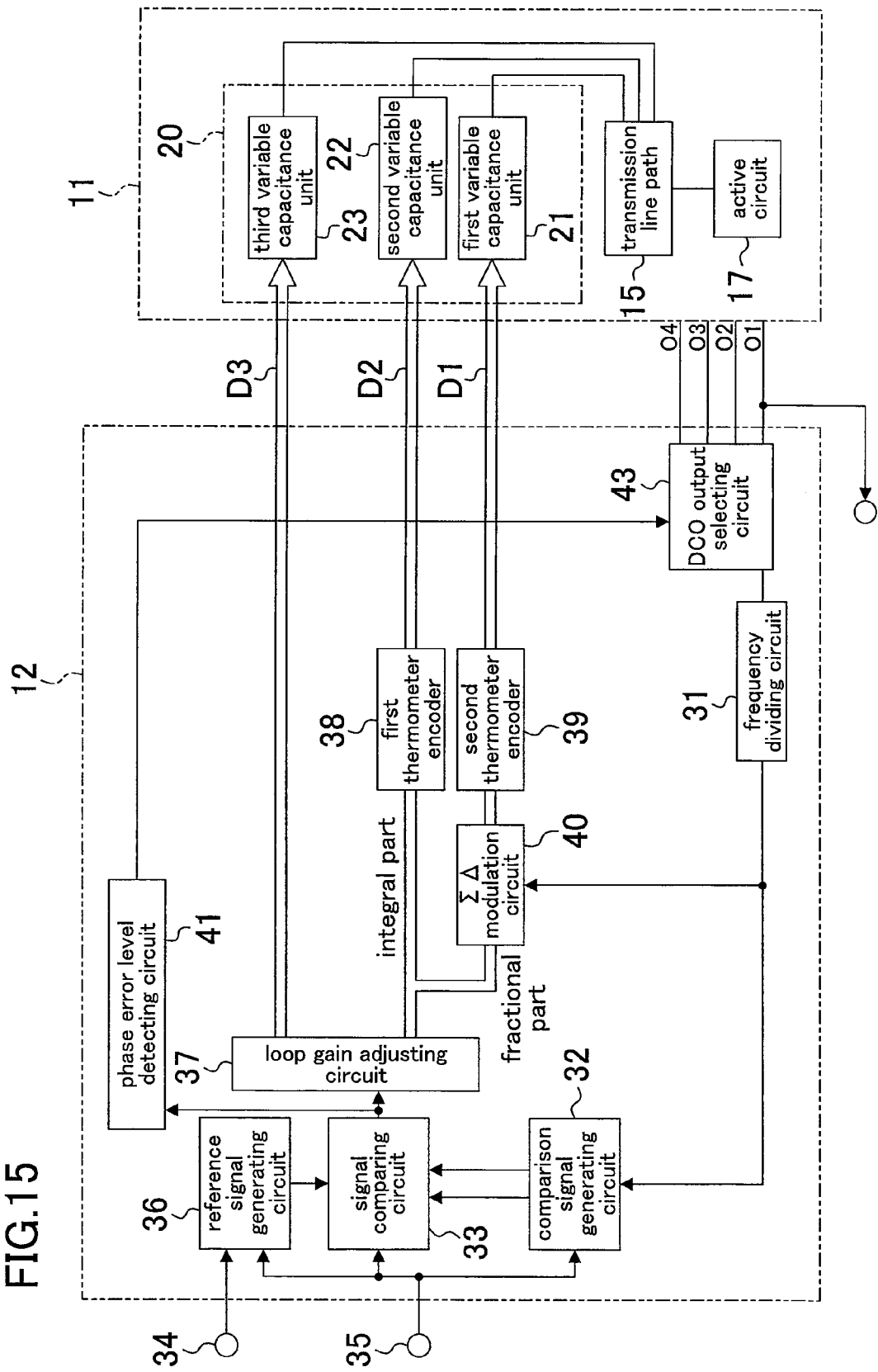
FIG. 15 is a block diagram showing a frequency synthesizer according to a third embodiment.

Hereafter, a third embodiment of the present disclosure will be described with reference to the drawings. FIG. 15 shows a block configuration of a frequency synthesizer according to the third embodiment. In FIG. 15, the same components as those of FIG. 3 are indicated by the same reference numerals and will not be described.

As shown in FIG. 15, in the frequency synthesizer of this embodiment, a DCO circuit 11 includes a first output O1, a second output O2, a third output O3, and a fourth output O4. An oscillation frequency control unit 12 includes a phase error level detecting circuit 41 for detecting a phase error level, and a DCO output selecting circuit 43 for selecting an output of the DCO circuit 11 based on the detected phase error level.

Figure 16:
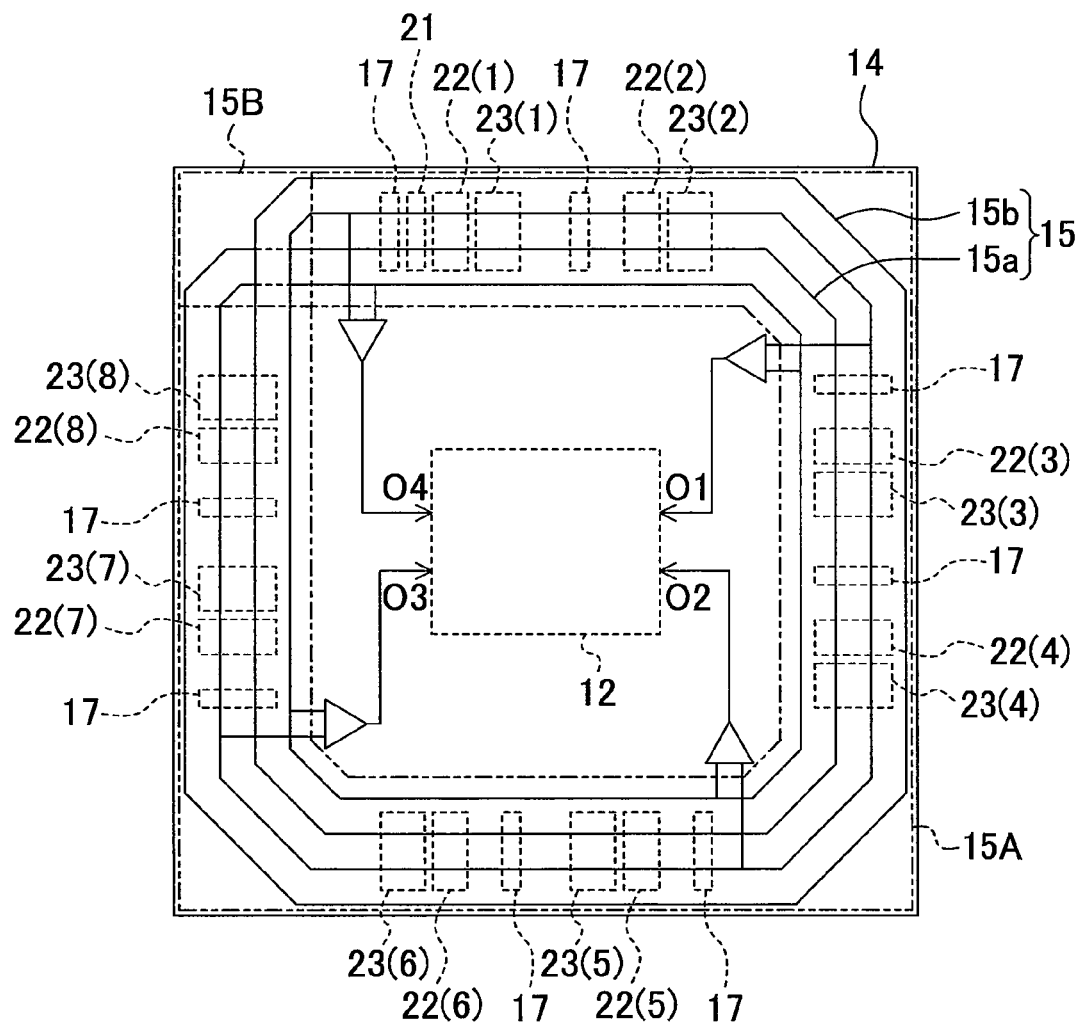
FIG. 16 is a plan view showing a layout of the frequency synthesizer of the third embodiment.

FIG. 16 shows a layout of the frequency synthesizer of this embodiment. As is different from FIG. 4, a first variable capacitance unit 21 is concentrated and arranged at a single position. Moreover, the first output O1, the second output O2, the third output O3 and the fourth output O4 are provided at different positions on a transmission line path 15. The first output O1, the second output O2, the third output O3 and the fourth output O4 are input to the DCO output selecting circuit 43 as shown in FIG. 15.

Figure 17:
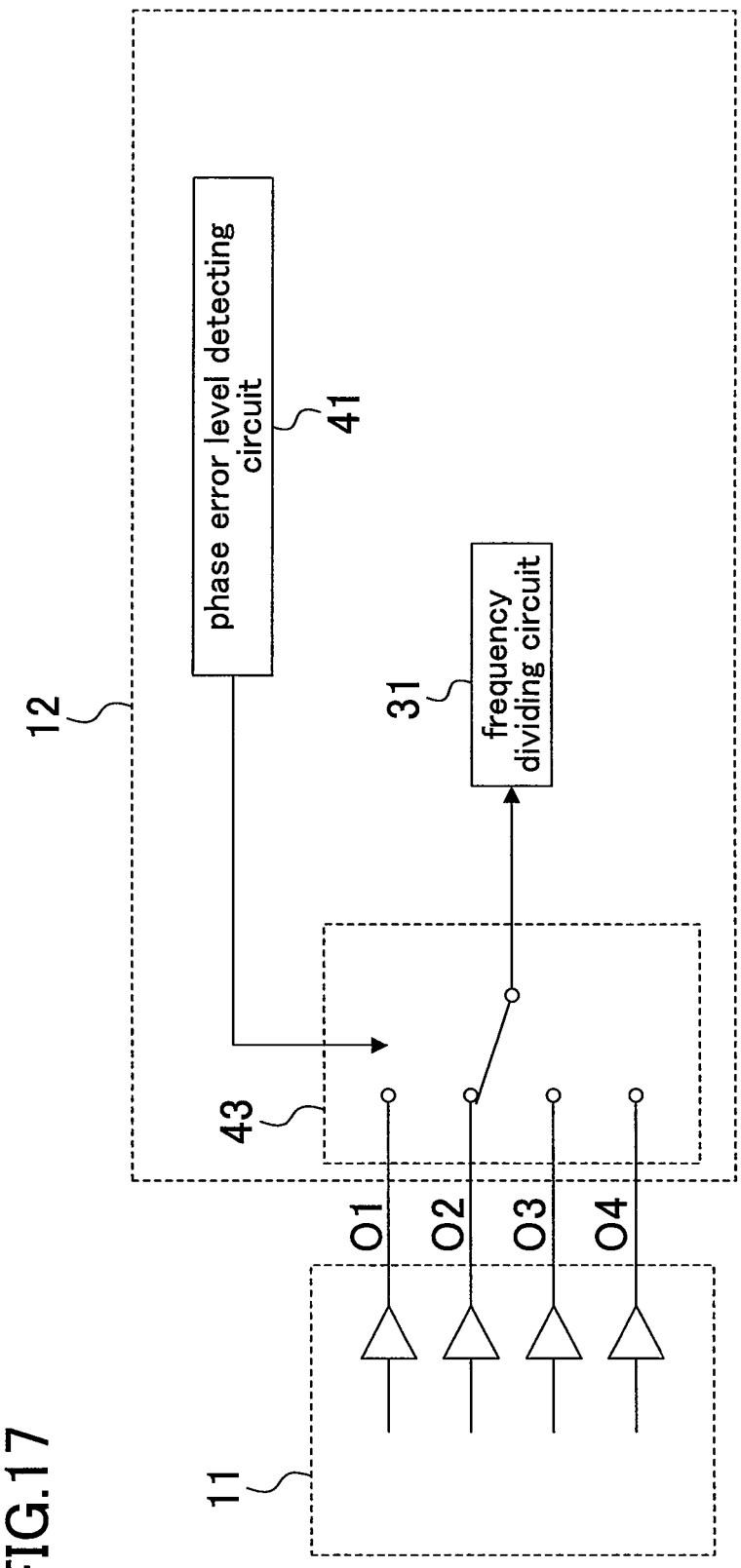
FIG. 17 is a diagram showing an equivalent circuit of an example DCO output selecting circuit of the frequency synthesizer of the third embodiment.

The phase error level detecting circuit 41 receives an output of the signal comparing circuit 33, and outputs switch data corresponding to a phase error level. Referring to FIG. 17, the DCO output selecting circuit 43 is a switch which is driven in accordance with the switch data output by the phase error level detecting circuit 41, and selects a DCO output corresponding to the switch data.

The phase error level detecting circuit 41 has a detection sequence and a stationary sequence. In the detection sequence, the first output O1, the second output O2, the third output O3 and the fourth output O4 are successively selected. As a result, a position of an output where a lowest phase error level is obtained is detected.

In the stationary sequence, the DCO output which has been detected in the detection sequence and has a smallest influence on phase noise is selected and operated.

Figure 18:
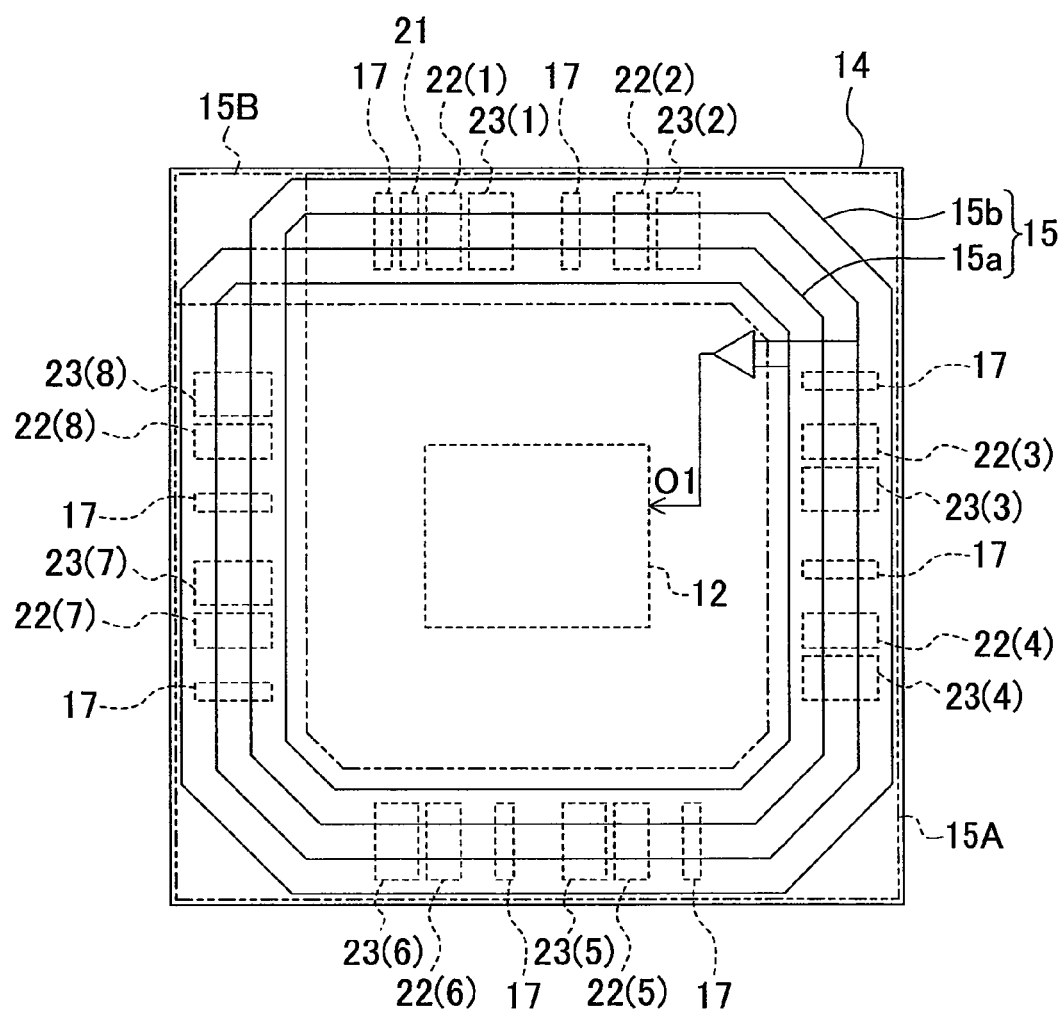
FIG. 18 is a plan view showing a layout of a variation of the frequency synthesizer of the third embodiment.
Figure 19:
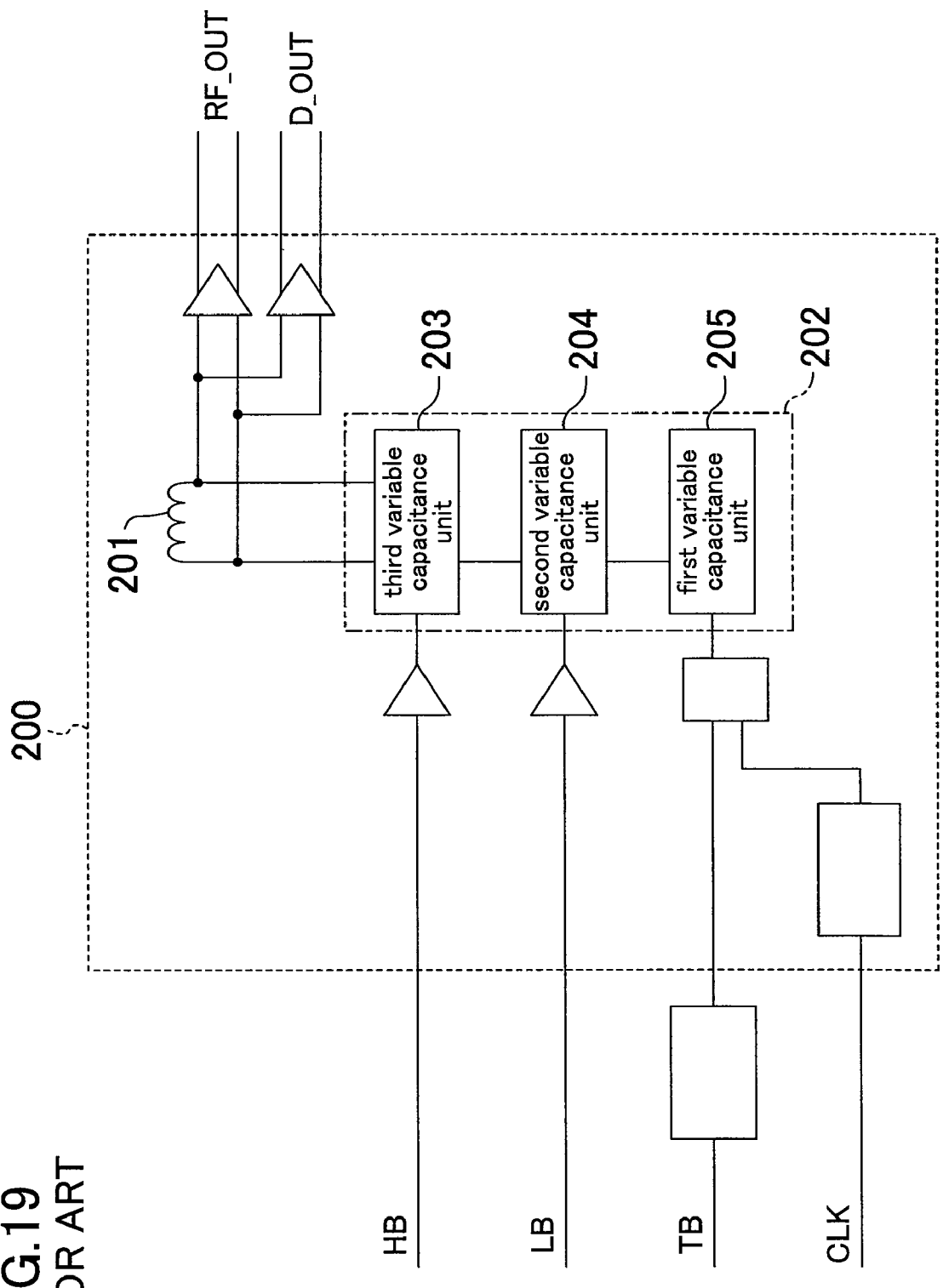
FIG. 19 is a block diagram showing an example conventional frequency synthesizer.

In FIG. 15, the output of the frequency synthesizer is assumed to be the first output O1. Alternatively, the output of the frequency synthesizer may be any one of the first output O1 to the fourth output O4. Moreover, the output of the frequency synthesizer may be extracted after the DCO output selecting circuit 43. Although there are assumed to be four DCO outputs above, the number of DCO outputs may be larger or smaller than four. Referring to FIG. 18, if there is only a single DCO output, the phase error level detecting circuit 41 and the DCO output selecting circuit 43 are not required. In this case, the position of an optimal output may be previously specified by means, such as evaluation by a cut-and-try method or the like, before the optimal output position may be selected.

Also in the third embodiment, a signal for generating switch data may be supplied from the outside of the frequency synthesizer. For example, when the frequency synthesizer is incorporated into a radio communication device, the switch data may be generated based on a noise level of a signal after frequency conversion of a received or transmit signal.

Although it has been assumed in the first to third embodiments and their variations that the transmission line path 15 has the single intersection portion 15B, the number of intersection portions is not limited to one and may be any odd number. Although it has also been assumed that the transmission line path 15 is in the shape of substantially a square, the transmission line path 15 may be in any loop-like shape, such as a circle, a polygon or the like. Moreover, the transmission line path 15 may have a plurality of bent portions so as to provide a long length. Note that when the oscillation frequency control unit 12 is provided inside the transmission line path 15, the transmission line path 15 preferably has a symmetrical outer shape. If the transmission line path 15 has a symmetrical shape and the oscillation frequency control unit 12 is provided at a center portion inside the transmission line path 15, the variable capacitance units, the control lines and the like can be more symmetrically arranged, resulting in stable control.

When variable capacitance elements are concentrated and arranged, the variable capacitance elements cannot be connected to exactly one point of the transmission line path 15. The variable capacitance elements may be concentrated and arranged in a predetermined region, depending on a size of the variable capacitance element or the like.

As described above, the digitally-controlled oscillator, the frequency synthesizer and the radio communication device of the present disclosure can provide a high frequency and a small minimum frequency change amount without increasing the phase noise of the digitally-controlled oscillator itself, and are useful for semiconductor integrated circuits.

The description of the embodiments of the present disclosure is given above for the understanding of the present disclosure. It will be understood that the disclosure is not limited to the particular embodiments described herein, but is capable of various modifications, rearrangements and substitutions as will now become apparent to those skilled in the art without departing from the scope of the disclosure. Therefore, it is intended that the following claims cover all such modifications and changes as fall within the true spirit and scope of the disclosure.

What is claimed is:

1. A digitally-controlled oscillator comprising:
a loop-shaped transmission line path having an odd number of parallel portions in each of which two conductors are arranged in parallel to each other with a space therebetween, and an odd number of intersection portions in each of which two conductors intersect spatially;
an active circuit coupled between the two conductors; and
a variable capacitance unit including a plurality of variable capacitance elements coupled between the two conductors, capacitance values of the plurality of variable capacitance elements being controlled in accordance with digital control data, wherein the variable capacitance unit includes a first variable capacitance unit including a plurality of first variable capacitance elements and a second variable capacitance unit including a plurality of second variable capacitance elements, and a high capacitance state and a low capacitance state of each of the first variable capacitance elements are switched in accordance with ΣΔ-modulated control data.

2. The digitally-controlled oscillator of claim 1, wherein the variable capacitance unit is divided into a plurality of variable capacitance element blocks each including a portion of the plurality of variable capacitance elements, and the plurality of variable capacitance element blocks are provided in different portions of the transmission line path.

3. The digitally-controlled oscillator of claim 1, wherein the transmission line path is provided on a semiconductor substrate, and at least a portion of the plurality of variable capacitance elements is provided in a region below the transmission line path.

4. The digitally-controlled oscillator of claim 1, wherein the variable capacitance unit has a third variable capacitance unit including a plurality of third variable capacitance elements, and a capacitance change amount between a high capacitance state and a low capacitance state of the third variable capacitance element is larger than that of the second variable capacitance element.

5. A frequency synthesizer comprising:
a digitally-controlled oscillator; and
an oscillation frequency control unit for controlling an oscillation frequency of the digitally-controlled oscillator,
wherein the digitally-controlled oscillator includes
a loop-shaped transmission line path having an odd number of parallel portions in each of which two conductors are arranged in parallel to each other with a space therebetween, and an odd number of intersection portions in each of which two conductors intersect while being electrically isolated from each other;
an active circuit coupled between the two conductors; and
a first variable capacitance unit including a plurality of first variable capacitance elements coupled between the two conductors and a second variable capacitance unit including a plurality of second variable capacitance elements coupled between the two conductors, and
the oscillation frequency control unit includes
a reference frequency signal generating circuit for generating a reference frequency signal;
a comparison signal generating circuit for generating a comparison signal based on an output of the digitally-controlled oscillator;
a signal comparing circuit for comparing the reference frequency signal and the comparison signal in terms of at least one of phase and frequency to generate digital control data; and
a ΣΔ modulation circuit for subjecting a portion of the digital control data to ΣΔ modulation to generate first control data for switching a high capacitance state and a low capacitance state of each of the plurality of first variable capacitance elements.

6. The frequency synthesizer of claim 5, wherein
the first variable capacitance unit is divided into a plurality of first variable capacitance element blocks each of which includes a portion of the plurality of first variable capacitance elements, and
the plurality of first variable capacitance element blocks are provided in different portions of the transmission line path.

7. The frequency synthesizer of claim 6, wherein
the oscillation frequency control unit selects a portion of the plurality of first variable capacitance element blocks and switches the high capacitance state and the low capacitance state of each of the first variable capacitance elements of the selected first variable capacitance element block, during one clock cycle of the ΣΔ modulation circuit.

8. The frequency synthesizer of claim 7, wherein
the oscillation frequency control unit selects the first variable capacitance element blocks in a manner which allows the selected first variable capacitance element blocks to be positionally distributed.

9. The frequency synthesizer of claim 8, wherein
the oscillation frequency control unit selects the first variable capacitance element blocks in accordance with a predetermined pattern.

10. The frequency synthesizer of claim 8, wherein
the oscillation frequency control unit selects the first variable capacitance element blocks in a random manner.

11. The frequency synthesizer of claim 6, wherein
corresponding ones of the first variable capacitance elements included in each of the plurality of first variable capacitance element blocks are connected in parallel.

12. The frequency synthesizer of claim 5, wherein
the second variable capacitance unit is divided into a plurality of second variable capacitance element blocks each of which includes a portion of the plurality of second variable capacitance elements, and
the plurality of second variable capacitance element blocks are provided in different portions of the transmission line path.

13. The frequency synthesizer of claim 12, wherein
the oscillation frequency control unit selects a portion of the plurality of second variable capacitance element blocks and switches the high capacitance state and the low capacitance state of each of the second variable capacitance elements of the selected portion of the plurality of second variable capacitance element blocks.

14. The frequency synthesizer of claim 13, wherein
the oscillation frequency control unit selects the second variable capacitance element blocks in a manner which allows the selected second variable capacitance element blocks to be positionally distributed.

15. The frequency synthesizer of claim 12, wherein
corresponding ones of the second variable capacitance elements included in each of the plurality of second variable capacitance element blocks are connected in parallel.

16. The frequency synthesizer of claim 6, wherein
the oscillation frequency control unit includes:
a data output selecting circuit for selecting the first variable capacitance element block to which the first control data is to be supplied.

17. The frequency synthesizer of claim 16, wherein
the oscillation frequency control unit includes:

a phase error level detecting circuit for detecting a phase error level in the signal comparing circuit, and the oscillation frequency control unit controls the data output selecting circuit so that the phase error level is minimized.

18. The frequency synthesizer of claim 16, wherein
the data output selecting circuit supplies control data different from the first control data to the first variable capacitance elements other than those of the selected first variable capacitance element block.

19. The frequency synthesizer of claim 5, wherein
the first variable capacitance elements are concentrated and arranged in a portion of the transmission line path.

20. The frequency synthesizer of claim 19, wherein
the digitally-controlled oscillator includes a plurality of output terminals connected to different portions of the transmission line path, and the oscillation frequency control unit includes:
   an oscillation output selecting circuit for selecting one of the plurality of output terminals.

21. The frequency synthesizer of claim 20, wherein
the oscillation frequency control unit includes:
   a phase error level detecting circuit for detecting a phase error level in the signal comparing circuit, and the oscillation frequency control unit controls the oscillation output selecting circuit so that the phase error level is minimized.

22. The frequency synthesizer of claim 5, wherein
the digitally-controlled oscillator includes:
   a third variable capacitance unit including a plurality of third variable capacitance elements coupled between the two conductors, and a capacitance change amount between a high capacitance state and a low capacitance state of the third variable capacitance element is larger than that of the second variable capacitance element.

23. The frequency synthesizer of claim 22, wherein
the third variable capacitance unit is divided into a plurality of third variable capacitance element blocks each of which includes a portion of the plurality of third variable capacitance elements, and the plurality of third variable capacitance element blocks are provided in different portions of the transmission line path.

24. The frequency synthesizer of claim 5, wherein
the transmission line path is provided on a semiconductor substrate and has a symmetrical outer shape, and the oscillation frequency control unit is provided at a center portion of a region inside the transmission line path in the semiconductor substrate.

25. The frequency synthesizer of claim 24, wherein
the transmission line path has a plurality of bent portions, and an average of spaces between the first variable capacitance elements and the oscillation frequency control unit is smaller than an average of spaces between the variable capacitance elements other than the first variable capacitance elements and the oscillation frequency control unit.

26. The frequency synthesizer of claim 5, wherein
the second variable capacitance elements include a variable capacitance element having the same capacitance change amount as that of the first variable capacitance element, and a variable capacitance element having a capacitance change amount which is an integral multiple of that of the first variable capacitance element.

27. A radio communication device comprising:
the frequency synthesizer of claim 16; and
at least one of a receiver circuit and a transmitter circuit which have a signal quality detecting circuit for detecting signal quality, wherein the oscillation frequency control unit controls the data output selecting circuit so that the signal quality is maximized.

28. A radio communication device comprising:
the frequency synthesizer of claim 20; and
at least one of a receiver circuit and a transmitter circuit which have a signal quality detecting circuit for detecting signal quality, wherein the oscillation frequency control unit controls the oscillation output selecting circuit so that the signal quality is maximized.

* * * * *